(12) United States Patent
Yamaguchi et al.

(10) Patent No.: US 6,418,030 B1
(45) Date of Patent: Jul. 9, 2002

(54) MULTI-CHIP MODULE

(75) Inventors: Masayoshi Yamaguchi, Kokubunji; Mitsutoshi Sawano, Tokyo; Kazutoshi Hohki, Hino, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 13 days.

(21) Appl. No.: 09/636,714

(22) Filed: Aug. 11, 2000

Related U.S. Application Data

(62) Division of application No. 08/617,843, filed as application No. PCT/JP94/01517 on Sep. 14, 1994, now Pat. No. 6,147,876.

(30) Foreign Application Priority Data

Sep. 14, 1993 (JP) .............................................. 5-228644
Aug. 15, 1994 (JP) .............................................. 6-191455

(51) Int. Cl.[7] ................................................ H05K 7/06
(52) U.S. Cl. ..................... 361/760; 361/738; 361/761; 361/763; 361/764; 361/766; 361/767; 361/768; 361/782; 361/783; 361/793; 361/803; 361/818; 257/698; 257/700; 257/704; 257/723; 257/724; 257/787
(58) Field of Search ............................... 361/734, 738, 361/748, 760–768, 771–774, 782, 783, 784, 803, 792–795, 818; 257/698, 700–703, 723, 724, 704, 787

(56) References Cited

U.S. PATENT DOCUMENTS

| | | | |
|---|---|---|---|
| 4,349,862 A | 9/1982 | Bajorek et al. ............... 361/762 |
| 4,437,141 A | 3/1984 | Prokop ........................ 361/784 |
| 4,574,255 A | 3/1986 | Fujii et al. ................... 361/795 |
| 4,616,655 A * | 10/1986 | Weinberg et al. ........... 361/761 |
| 4,759,056 A | 7/1988 | Akiyama ..................... 379/197 |
| 4,780,795 A * | 10/1988 | Meinel ........................ 361/765 |
| 4,800,459 A | 1/1989 | Takagi et al. ............... 361/762 |
| 4,811,082 A | 3/1989 | Jacobs et al. ............... 361/749 |
| 4,882,657 A * | 11/1989 | Braun ......................... 361/784 |
| 4,975,765 A | 12/1990 | Ackermann et al. ........ 257/723 |
| 5,110,664 A | 5/1992 | Nakanishi et al. .......... 361/793 |
| 5,166,772 A | 11/1992 | Soldner et al. ............. 257/659 |
| 5,220,488 A * | 6/1993 | Denes ......................... 361/782 |
| 5,225,969 A | 7/1993 | Takaya et al. .............. 361/792 |
| 5,235,496 A * | 8/1993 | Chomette et al. ........... 361/764 |
| 5,237,204 A * | 8/1993 | Val ............................. 257/698 |
| 5,239,198 A | 8/1993 | Lin et al. .................... 257/779 |
| 5,293,067 A | 3/1994 | Thompson et al. ......... 257/730 |
| 5,306,948 A * | 4/1994 | Yamada et al. ............. 361/767 |
| 5,309,326 A | 5/1994 | Minoru ....................... 361/790 |

(List continued on next page.)

FOREIGN PATENT DOCUMENTS

| | | | |
|---|---|---|---|
| JP | 63-104361 | 5/1988 | |
| JP | 2-106087 | 4/1990 | .................. 439/70 |
| JP | 4-130470 | 11/1992 | |
| JP | 4-335561 | 11/1992 | |
| JP | 5-55450 | 3/1993 | .................. 257/686 |

OTHER PUBLICATIONS

Internal Capacitors and Resistors for Multilayer Ceramic Modules, by R.O. Lussow, IBM Technical Disclosure Bulletin, vol. 20, No. 9, Feb. 1978, pp. 3436–3437.

*Primary Examiner*—David L. Talbott
*Assistant Examiner*—John B. Vigushin
(74) *Attorney, Agent, or Firm*—Finnegan, Henderson, Farabow, Garrett & Dunner, L.L.P.

(57) ABSTRACT

A multi-chip module includes bare IC chips mounted on respective areas of a printed wiring board. Outer electrode pads on the peripheries of the board are soldered to another printed wiring board such as a motherboard. Lead pads and the outer electrode pads are interconnected through a circuit pattern, through holes, and interstitial via holes. The circuit pattern is disposed on a die bonding surface of the bare IC chips for which insulation is not necessary.

37 Claims, 28 Drawing Sheets

U.S. PATENT DOCUMENTS

| | | | |
|---|---|---|---|
| 5,355,016 A | 10/1994 | Swirbel et al. | 257/659 |
| 5,428,885 A * | 7/1995 | Takaya et al. | 361/738 |
| 5,471,368 A | 11/1995 | Downie et al. | 361/784 |
| 5,481,432 A | 1/1996 | Tsukada et al. | 361/686 |
| 5,557,142 A | 9/1996 | Gilmore et al. | 257/659 |
| 5,714,239 A * | 2/1998 | Maeda et al. | 361/766 |
| 5,793,105 A * | 8/1998 | Pace | 257/700 |
| 5,854,534 A | 12/1998 | Beilin et al. | 361/794 |

* cited by examiner

MULTI-CHIP MODULE

This is a division of application Ser. No. 08/617,843, originally filed Jun. 13, 1996 and filed as a CPA Oct. 15, 1999 which is incorporated herein by reference.

TECHNICAL FIELD

The present invention relates to a multi-chip module (MCM) in which a plurality of bare IC chips are mounted on a printed wiring board.

BACKGROUND ART

As the decrease in size and the enhancement in performance of electronic equipment are required. integrated circuits (ICs) mounted on a printed wiring board 1 as shown in FIG., 1 have been evolving from package-type ICs 2 to bare IC chips 3 shown in FIG. 2, and further to multi-chip modules 5 as shown in FIG. 3.

In an arrangement shown in FIG. 2. bare IC chips 3 are mounted directly on a printed wiring board 1 by means of die bonding and wire bonding. The areas of the printed wiring board required for mounting the bare IC chips are smaller as compared with a case in which package-type ICs 2 covered with armoring material such as plastic or ceramics are mounted on the printing wiring board 1. However, if after mounting a lot of bare ICs chips 3 on a printed wiring board 1, any of the bare ICs chips 3 is found to be defective, the board 1 itself is scrapped because it is difficult and troublesome to remove the defective bare IC chip from the board 1 (to repair the board 1). In other words, there is a problem that the manufacturing process results in a poor yield.

A multi-chip module 5 which solves the above problem is shown in FIG. 3. Referring to FIGS. 4 and 5, the manufacturing process of this multi-chip module 5 is briefly described. In the process, bare IC chips 52 are fixed by die bonding on a multilayer printed wiring board 51, and the electrical connections are achieved by wire bonding. Each bare IC chip is fit with a dam frame, and sealed with resin. Then, lead terminals 55 of the Gull Wing Type are soldered as outer electrodes to the electrode pads provided on the peripheral regions of the printed wiring board 51, thus completing the multi-chip module 5.

Since in case of multi-chip modules 5, each multi-chip module can be tested alone in the operation, only the multi-chip modules 5 which have been passed the test can be mounted on a printed wiring board such as a mother board (hereinafter, a printed wiring board on which multi-chip modules are to be mounted is referred to as a "target printed wiring board").

However, there are following problems in these conventional multi-chip modules. First, a lot of lead terminals 55 have to be soldered to the periphery of the printed wiring board 51. For this, the number of working processes increases, and the packaging density on a target printed wiring board 1 is reduced by the areas on the target printed wiring board 1 which are occupied by the lead terminals 55.

In the second place, the size of the printed wiring board 51 becomes larger as compared with the size of bare IC chips mounted on the printed wiring board 51 because a circuit pattern (not shown) for electrically interconnecting a plurality of bare IC chips 52 has to be provided around the bare IC chips 52.

In the third place, in such an arrangement that each bare IC chip 52 is fit with a dam frame 53 for sealing with resin 57, large areas are occupied by the dam frames 53 so attached as to enclose the respective bare IC chips 52. This also causes the size of the printed wiring board 51 to become large.

Also, the dam frames 53 are glued to the printed wiring board 51 by inserting projections 53a provided on each dam frame 53 into holes 51a of the printed wiring board 51 for positioning. Accordingly, the printed wiring board 51 is provided with a lot of positioning holes 51a, which make the circuit pattern complicated and cause the size of the printed wiring board 51 to become large.

Further, if sections of a multi-chip module 5 which have been enclosed by dam frames 53 are to be absorbed by a vacuum absorber 7 in mounting the multi-chip module 5 on a target printed wiring board 1, enough absorption area can not be obtained because of the small size of each dam frame 53. Thus, the absorbing and holding of multi-chip module is difficult, and operations tend to be unstable.

In the fourth place, if resistors and capacitors for adjusting the circuit are provided for a multi-chip module to form a compound module, then around the bare IC chips 52 there have to be extra areas where chip resistor elements, chip capacitor elements and electrode pads to which they are soldered are disposed. This also cause the size of the printed wiring board 51 to become large. And, since the chip elements have to be soldered after sealing the bare IC chips with resin, the number of working processes increase.

On the other hand, if the chip resistor and capacitor elements are mounted on the printed wiring board on which the multi-chip module 5 is mounted, the area for mounting the module 5 including the chip elements increases, causing the size of the target printed wiring board to become large.

As described above, in conventional multi-chip module: the number of attaching processes of the lead terminals; the size becomes larger in accordance with the number of the lead terminals; the printed wiring board increases in size because of a circuit pattern for interconnecting the bare IC chips; the number of processes of attaching dam frames to the bare IC chips; the attaching of dam frames causes the size of the printed wiring board; it is difficult to vacuum-absorbing dam frame sections for mounting the multi-chip module to the target printed wiring board.

There is also another problem that if resistors and capacitors for adjusting the circuit are provided for a multi-chip module to form a compound module, then the size of the multi-chip module becomes large, thereby increasing the size of the printed wiring board on which the multi-chip module is mounted.

The present invention is intended for solving these and other problems and disadvantages of the prior art. An object of the invention is to providing a multi-chip module which can be made smaller than a conventional one, which can be manufactured in a reduced number of process. and which can be easily mounted to a target printed wiring board by means of vacuum absorption.

DISCLOSURE OF INVENTION

Solution

A multi-chip module according to a first aspect of the invention comprises a printed wiring board (100) and a plurality of bare IC chips (201 through 203), is mounted on a target printed wiring board (1), and is characterized by outer electrode pads (105) disposed along the peripheral portion of the printed wiring board, each having a geometry in which cutting a through hole longitudinally into halves results, the outer electrode pads being to be soldered to the target printed wiring board.

A multi-chip module according to a second aspect of the invention comprises a printed wiring board (100) and a plurality of bare IC chips (201 through 203), is mounted on a target printed wiring board (1), and is so arranged that: a circuit pattern is provided on each of at least one of the areas of the printed wiring board on which the plurality of bare IC chips are mounted; and an insulating layer is provided on each of the circuit patterns.

A multi-chip module according to a third aspect of the invention is so arranged that: a circuit pattern is provided on each of at least one of the areas of the printed wiring board on which the plurality of bare IC chips are mounted; and an insulating layer is provided on each of the circuit patterns.

A multi-chip module according to a fourth aspect of the invention comprises a printed wiring board (100) and a plurality of bare IC chips (201 through 203), is mounted on a target printed wiring board (1), and is so arranged that: at least one of a printed resistor element and a printed dielectric is provided on each of at least one of the areas of the printed wiring board on which the plurality of bare IC chips are mounted; and an insulating layer is provided on each of the at least one of the printed resistor element and the printed dielectric.

A multi-chip module according to a fifth aspect of the invention is so arranged that: at least one of a printed resistor element and a printed dielectric is provided on each of at least one of the areas of the printed wiring board on which the plurality of bare IC chips are mounted; and an insulating layer is provided on each of the at least one of the printed resistor element and the printed dielectric.

A multi-chip module according to a sixth aspect of the invention comprises a printed wiring board (100) and a plurality of bare IC chips (201 through 203) mounted on the printed wiring board, is to be mounted on a target printed wiring board (1), and is so arranged that: the printed wiring board has a multilayer structure: the printed wiring board is provided with inner conductor layers within the multilayer structure and connecting portions such as interstitial via holes leading from the bare IC chip mounting side to the inner conductor layers; and the bare IC chips are electrically interconnected via the interstitial via holes and the inner conductor layers.

A multi-chip module according to a seventh aspect of the invention is so arranged that: the printed wiring board has a multilayer structure; the printed wiring board being provided with inner conductor layers within the multilayer structure and interstitial via holes leading from the bare IC chip mounting side to the inner conductor layers; and the bare IC chips are electrically interconnected via the interstitial via holes and the inner conductor layers.

A multi-chip module according to an eighth aspect of the invention comprises a printed wiring board (100) and a plurality of bare IC chips (201 through 203), is mounted on a target printed wiring board (1), and is so arranged that: the printed wiring board has a multilayer structure; and within the multilayer structure, there are provided at least one resistor element both the ends of which are electrically connected to inner conductor layers within the multilayer structure.

A multi-chip module according to a ninth aspect of the invention is so arranged that: the printed wiring board has a multilayer structure; and within the multilayer structure, there are provided at least one resistor element both the ends of which are electrically connected to inner conductor layers within the multilayer structure.

A multi-chip module according to a tenth aspect of the invention comprises a printed wiring board (100) and a plurality of bare IC chips (201 through 203), is mounted on a target printed wiring board (1), and is so arranged that: the printed wiring board has a multilayer structure; and within the multilayer structure, there are provided at least one dielectric layer both the sides of which are electrically connected to inner conductor layers within the multilayer structure.

A multi-chip module according to an eleventh aspect of the invention is so arranged that: the printed wiring board has a multilayer structure; and within the multi layer structure, there are provided at least one dielectric layer both the sides of which are electrically connected to inner conductor layers within the multilayer structure.

A multi-chip module according to a twelfth aspect of the invention comprises a printed wiring board (100) and a plurality of bare IC chips (201 through 203), is mounted on a target printed wiring board (1), and is so arranged that: the printed wiring board has a multilayer structure; and within the multilayer structure, there are provided at least one resistor element both the ends of which are electrically connected to inner conductor layers within the multilayer structure and at least one dielectric layer both the sides of which are electrically connected to inner conductor layers within the multilayer structure.

A multi-chip module according to a thirteenth aspect of the invention is so arranged that: the printed wiring board has a multilayer structure; and within the multilayer structure, there are provided at least one resistor element both the ends of which are electrically connected to inner conductor layers within the multilayer structure and at least one dielectric layer both the sides of which are electrically connected to inner conductor layers within the multilayer structure.

A multi-chip module according to a fourteenth aspect of the invention is so arranged that at least one of a printed resistor element and a printed dielectric permitting trimming for adjustment is provided outside the areas on the surface of the printed wiring board on which the plurality of bare IC chips are mounted.

A multi-chip module according to a fifteenth aspect of the invention comprises a printed wiring board (100) and a plurality of bare IC chips (201 through 203), is mounted on a target printed wiring board (1), and is characterized by a dam frame so provided on the printed wiring board as to enclose the plurality of bare IC chips, the inside of the dam frame being filled with resin for sealing the bare IC chips.

A multi-chip module according to a sixteenth aspect of the invention is characterized by a dam frame so provided on the printed wiring board as to enclose the plurality of bare IC chips, the dam frame being filled with resin for sealing the bare IC chips.

A multi-chip module according to a seventeenth aspect of the invention is so arranged that the dam frame is provided with a reinforcing part railing between two of the bare IC chips.

A multi-chip module according to an eighteenth aspect of the invention is so arranged that chip electrode pads are disposed on the periphery of the bare IC chips on the bare IC chip mounting side of the printed wiring board, so that the boundary between the chip electrode pads and the surrounding area of them serves as reference for positioning of the dam frame when the dam frame is mounted.

A multi-chip module according to a nineteenth aspect of the invention is so arranged that chip electrode pads are disposed on the periphery of the bare IC chips on the bare IC chip mounting side of the printed wiring board, and a solder resist is provided adjacent to the chip electrode pads.

so that the boundary between the chip electrode pads and the solder resist serves as reference for positioning of the dam frame when the dam frame is mounted.

A multi-chip module according to a twentieth aspect of the invention is so arranged that the dam frame is filled with resin for sealing the bare IC chips so that the surface of the resin is not higher than the upper face of the dam frame.

A multi-chip module according to a twenty-first aspect of the invention is so arranged that the bare IC chips are mounted on the printed wiring board by means of flip chip bonding.

A multi-chip module according to a twenty-second aspect of the invention comprises a printed wiring board (100) and a plurality of bare IC chips (201 through 203), is mounted on a target printed wiring board (1), and is characterized by through holes provided on the margin of the printed wiring board as outer electrode pads which are to be soldered to the mother board.

A multi-chip module according to a twenty-third aspect of the invention comprises a printed wiring board (100) and a plurality of bare IC chips (201 through 203), is mounted on a target printed wiring board (1), and is characterized by outer electrode pads which are to be soldered to the mother board, each pad extending from a point on the margin of the printed wiring board and across the end face of the printed wiring board.

A multi-chip module according to a twenty-fourth aspect of the invention is so arranged that the outer electrode pads are soldered to lands of the target printed wiring board with the multi-chip module face to face with or perpendicular to the target printed wiring board.

A multi-chip module according to a twenty-fifth aspect of the invention is so arranged that after mounting the bare IC chips within the dam frame and sealing the bare IC chips by filling the dam frame with resin, other bare IC chips are disposed on the dam frame and the resin.

A multi-chip module according to a twenty-sixth aspect of the invention is so arranged that: the printed wiring board is provided with through holes or concavities in which the bare IC chips are disposed; and the bare IC chips are disposed in the through holes or concavities and connected by means of wire bonding.

A multi-chip module according to a twenty-seventh aspect of the invention is so arranged that the target printed wiring board is provided with a through hole; the multi-chip module is disposed in the through hole; and the external electrode pads of the multi-chip module are soldered to lands of the target printed wiring board.

A multi-chip module according to a twenty-eighth aspect of the invention is so arranged that the bare IC chips are directly connected to the outer electrode pads by means of wire bonding.

A multi-chip module according to a twenty-ninth aspect of the invention is so arranged that a printed conductor which serves as an inductance for processing a high frequency signal is formed together with the at least one of a printed resistor element and a printed dielectric.

A multi-chip module according to a thirtieth aspect of the invention is so arranged that a flexible printed wiring board is used as a target printed wiring board on which the multi-chip module is mounted.

A multi-chip module according to a thirty-first aspect of the invention is so arranged that a dam frame is formed of a metal member and the bare IC chips are sealed with heat conductive resin so as to facilitate heat radiation from the bare IC chips.

A multi-chip module according to a thirty-second aspect of the invention is so arranged that a dam frame is formed of a metal member in such a shape that the top of the dam frame is extend to cover the bare IC chips, and the bare IC chips are sealed with heat conductive resin so as to facilitate heat radiation from the bare IC chips.

A multi-chip module according to a thirty-third aspect of the invention is characterized by a conductive cover for shielding the bare IC chips disposed on the printed wiring board from electromagnetic field.

A multi-chip module according to a thirty-fourth aspect of the invention is further characterized by a conductive cover for shielding the multi-chip module disposed on the target printed wiring board from electromagnetic field.

A multi-chip module according to a thirty-fifth aspect of the invention is characterized in that the printed wiring board of the multilayer structure is formed of ceramic material, glass epoxy material, and/or resin material.

Advantageous Effects

In a multi-chip module according to any of the 1st, 5th, 7th, 9th, 11th, 12th, 16th, 22nd, 23rd and 28th aspects of the invention, the geometry of each outer electrode pad which cutting a through hole in the longitudinal direction yields for soldering the multi-chip module to the target printed wiring board, outer electrode pads each comprising a through hole provided on the margin, outer electrode pads extending from the margin and across the end face, or the direct connection between the bare IC chips and the outer electrode pads by means of wire bonding eliminates the need of providing the margin of the printed wiring board with lead terminals as is done in conventional multi-chip modules.

In a multi-chip module according to any of the 2nd, 5th, 7th, 9th, 11th, 12th and 16th aspects of the invention, a circuit pattern is disposed in areas on the printed wiring board where bare IC chips are mounted, resulting in a reduction of the circuit pattern which is to be provided around the bare IC chips.

In a multi-chip module according to any of the 3rd, 5th, 7th, 9th, 11th, 12th and 16th aspects of the invention, the circuit pattern which is to be provided around the bare IC chips is reduced because there is no need for providing the lead terminals as in the multi-chip modules of the 1st or 2nd aspect of the invention.

In a multi-chip module according to any of the 4th, 5th, 7th, 9th, 11th, 12th, 16th and 29th aspects of the invention, there is no need for providing chip resistor elements, chip capacitors or inductors around the bare IC chips because resistor elements, capacitors and inductors can be formed on the areas, on the printed wiring board, where the bare IC chips are mounted.

In a multi-chip module according to any of the 6th, 7th, 9th, 11th, 12th, 16th and 35th aspects of the invention, the bare IC chips are electrically interconnected via interstitial via holes and inner conductor layers provided within a multilayer structure formed of ceramic material, glass epoxy material, and/or resin material. Accordingly, the circuit pattern which has to be provided around the bare IC chips is reduced.

In a multi-chip module according to any of the 8th, 9th and 16th aspects of the invention, since resistor elements can be formed within the printed wiring board, there is no need for providing chip resistor elements on the surface of the printed wiring board.

In a multi-chip module according to any of the 10th, 11th and 16th aspects of the invention, since capacitors can be formed within the printed wiring board, there is no need for providing chip capacitors on the surface of the printed wiring board.

In a multi-chip module according to any of the 12th, 13th and 16th aspects of the invention, since resistor elements, capacitors, and inductors are formed within the printed wiring board, there is no need for providing chip resistor elements, chip capacitors, and inductors on the surface of the printed wiring board.

In a multi-chip module according to any of the 14th, 16th and 29th aspects of the invention, there is provided printed resistor elements, printed dielectrics and printed inductors, which has effects of not only any of the 1st through 13th aspects of the invention but also permitting a fine adjustment of operational characteristics of the circuit by removing a part of the printed resistor elements, the printed dielectrics and the printed inductors.

In a multi-chip module according to any of the 15th, 16th and 25th aspects of the invention, since a single dam frame encloses a plurality of bare IC chips, there is no need for providing each bare IC chip with a dam frame.

A multi-chip module according to the 17th aspect of the invention has not only the effect of 15th or 16th aspect of the invention but also the effect of reducing a strain caused by heat at the time of resin sealing and reflow soldering because the dam frame is provided with a reinforcing part.

Since in a multi-chip module according to the 18th aspect of the invention the dam frame is mounted on the printed wiring board being positioned on the basis of the boundary between the electrode pads and the surrounding area, there is no need for providing the printed wiring board with holes in which the dam frames are mounted, as in case of the 15th through 17th aspects of the invention.

In a multi-chip module according to the 19th aspect of the invention, the boundary between the electrode pads (e.g., golden color) and solder resist (e.g., green) provided adjacently to the electrode pads for preventing the solder from bridging electrode pads is used as a reference position for dam frame mounting. The color difference makes the boundary more clear.

In a multi-chip module according to the 20th aspect of the invention, since the surface of the resin filling the dam frame enclosing a plurality of bare IC chips is not higher than the dam frame, the area enclosed by the dam frame can be easily absorbed by a vacuum absorber.

In a multi-chip module according to the 21st aspect of the invention, since the bare IC chips are mounted on the printed wiring board by means of flip chip bonding, there is no need for disposing bonding pads around the bare IC chips on the surface of the printed wiring board.

In a multi-chip module according to the 24th aspect of the invention, there is a degree of freedom of the way of mounting the multi-chip module in that the multi-chip module may be disposed in parallel or perpendicular to a target printed wiring board.

In a multi-chip module according to the 25th aspect of the invention, after mounting the bare IC chips within the dam frame and sealing the bare IC chips by filling the dam frame with resin, other bare IC chips are disposed on the dam frame and the resin. Accordingly, a larger number of bare IC chips can be disposed on the multi-chip module.

In a multi-chip module according to the 26th or 27th aspect of the invention, the bare IC chips are disposed in holes or concavities of a target printed wiring board and connected to the board by means of wire bonding, or the multi-chip module is inserted in a hole of a target printed wiring board. Therefore, the total thickness is kept thin.

In a multi-chip module according to the 30th aspect of the invention, the multi-chip module is disposed on a flexible wiring board, which enables three-dimensional disposition.

In a multi-chip module according to the 31th or 32th aspect of the invention, the sealing is achieved with a metal dam frame and heat-conductive resin. and accordingly the heat radiation from the bare IC chips is ensured.

In a multi-chip module according to the 33th or 34th aspect of the invention, the bare IC chips or the multi-chip module are covered with a conductive cover preventing electrodes from being short-circuited, and are shielded from electromagnetic field.

BRIEF DESCRIPTION OF DRAWINGS

The above and other objects and aspects of the present invention will be apparent from the following description of the preferred embodiments of the invention with reference to the accompanying drawings. It is to be expressly understood, however, that the embodiments shown in the drawings are for the purpose of illustration and better understanding only and are not intended as definitions of the limits of the invention. In the drawings.

BEST MODE FOR CARRYING OUT THE INVENTION

Referring to FIGS. 7 through 26, a multi-chip module according to a preferred embodiment of the invention will be described.

Figure 1:
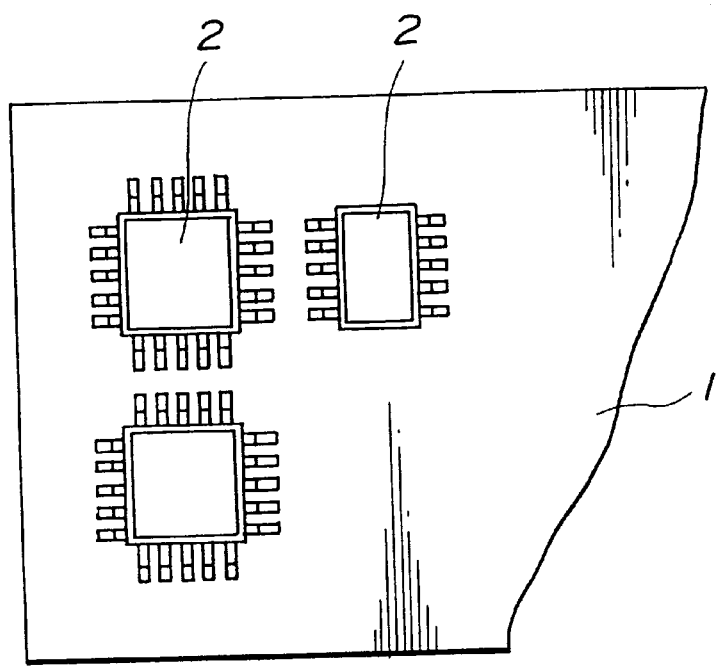
FIG. 1 is a plan view of a printed wiring board on which conventional ICs of the package type are mounted.
Figure 2:
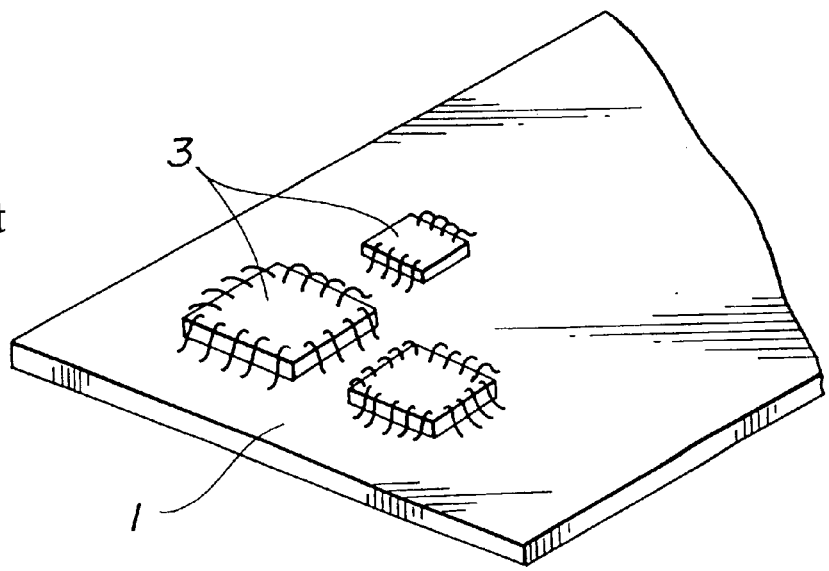
FIG. 2 is a perspective view of a printed wiring board on which conventional bare IC chips are mounted.
Figure 3:
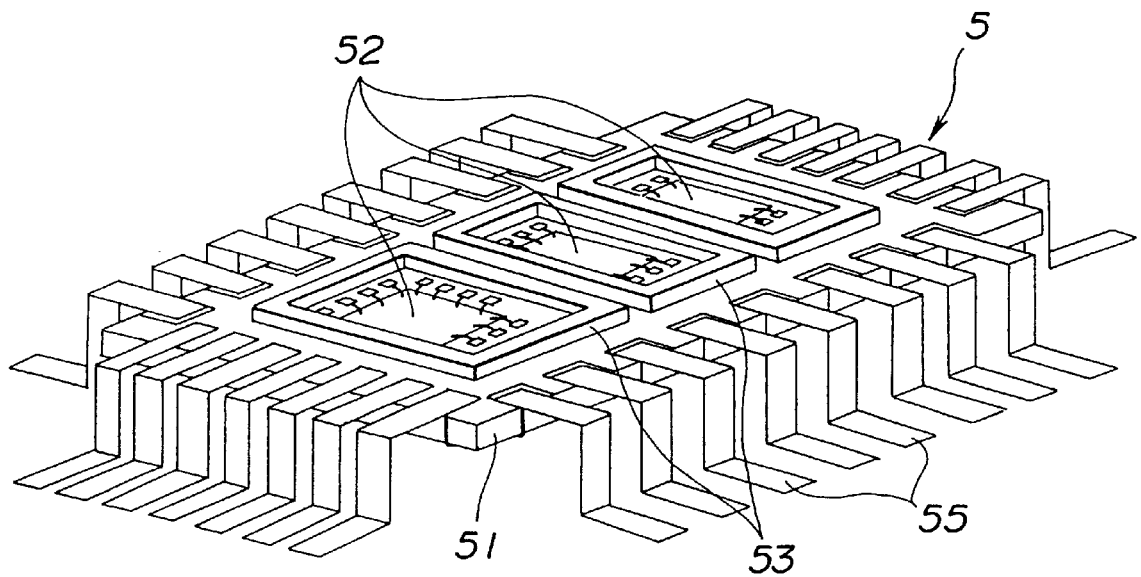
FIG. 3 is a perspective view of a conventional multi-chip module.
Figure 4:
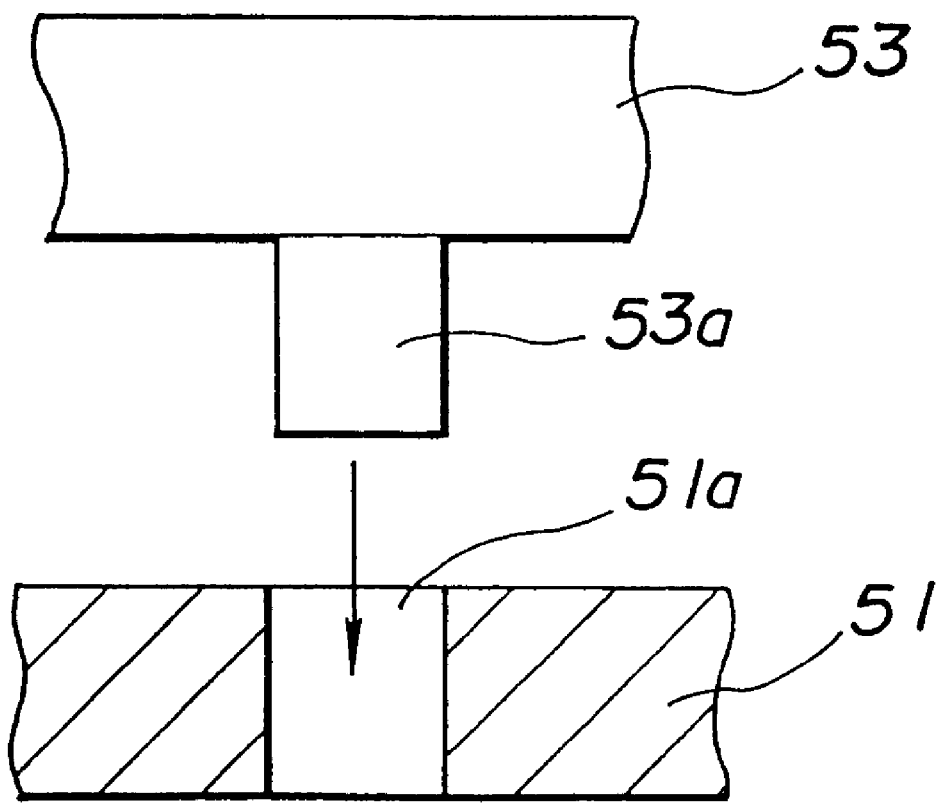
FIG. 4 is an enlarged view of a relevant part of a dam frame and a printed wiring board of the multi-chip module shown in FIG. 1.
Figure 5:
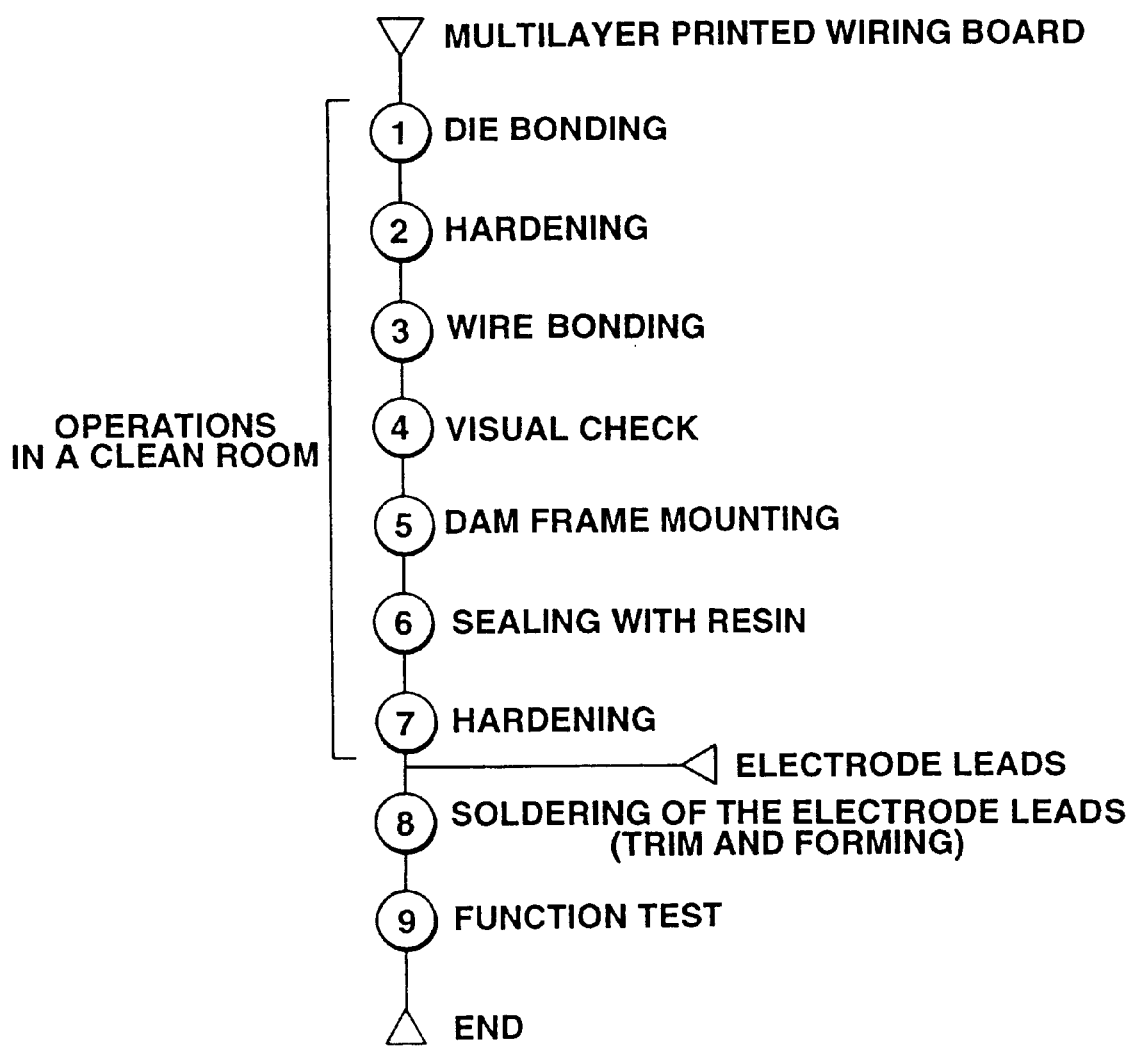
FIG. 5 is a diagram showing a manufacturing process of the multi-chip module shown in FIG. 1.
Figure 6:
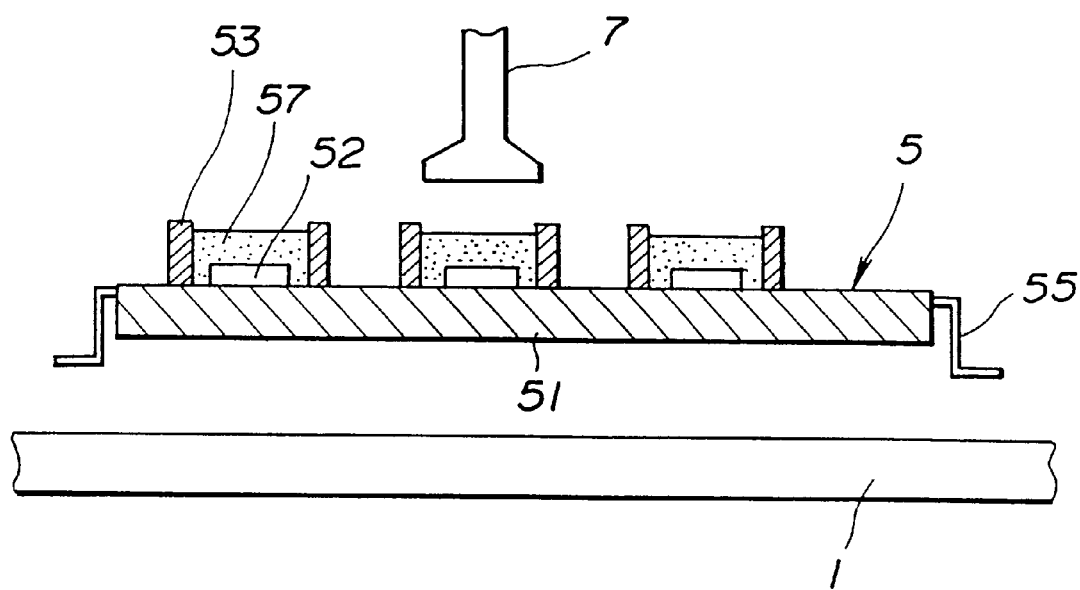
FIG. 6 is a section view showing how multi-chip modules shown in FIG. 1 are mounted.
Figure 7:
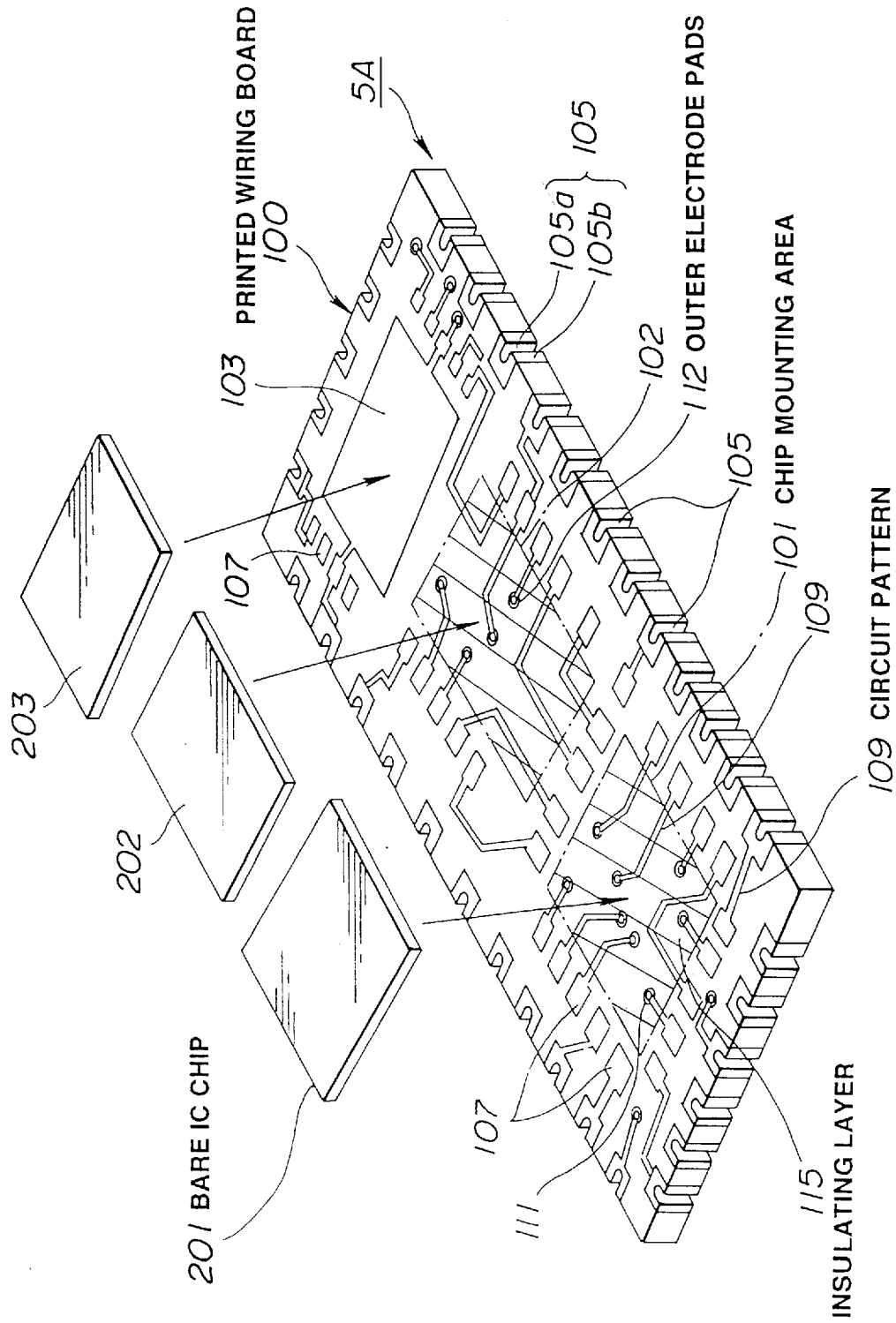
FIG. 7 is an exploded perspective view of a multi-chip module of a first illustrative embodiment of the invention.
Figure 8:
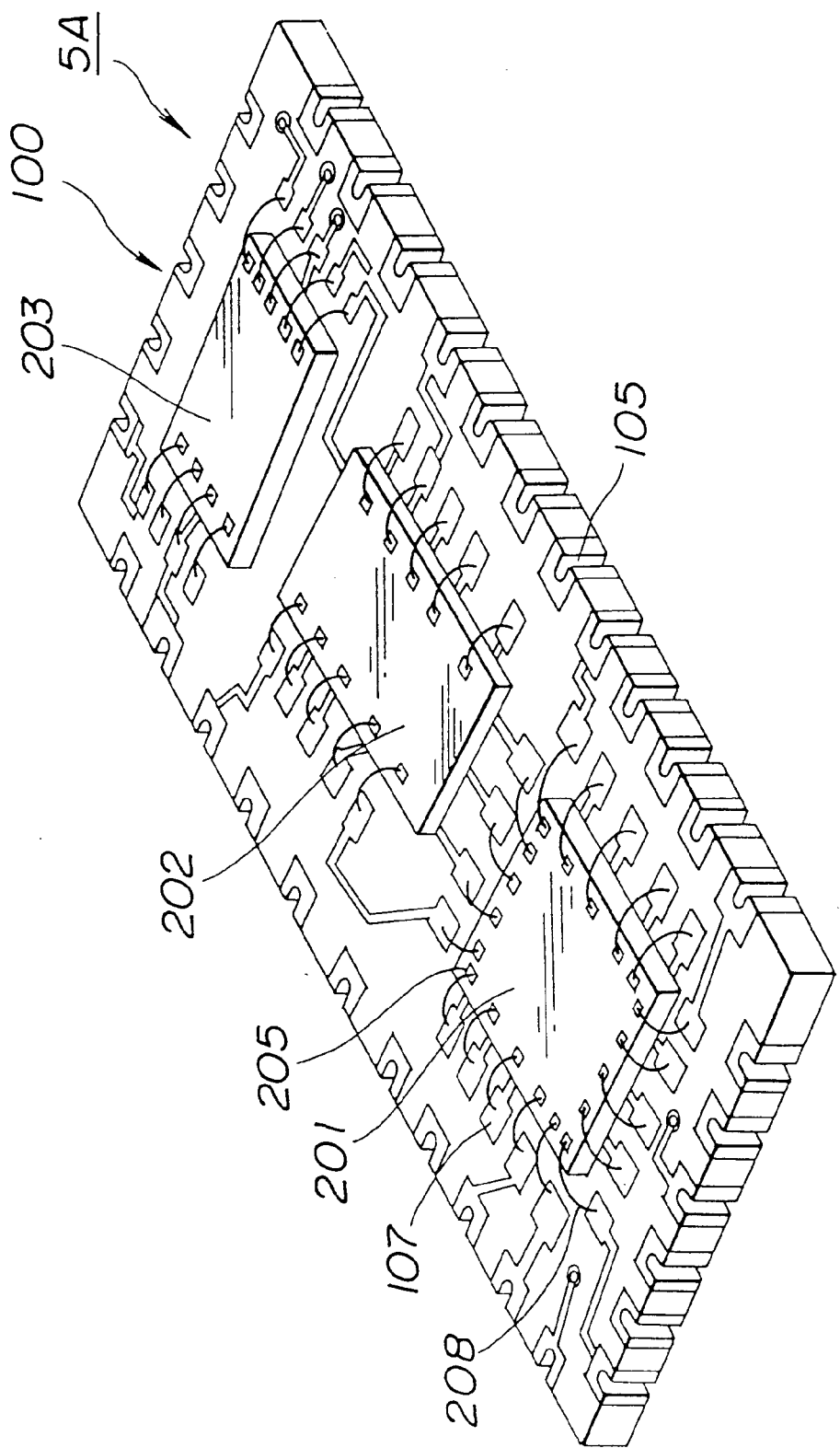
FIG. 8 is a perspective view showing an assembled state of the multi-chip module shown in FIG. 7.
Figure 9:
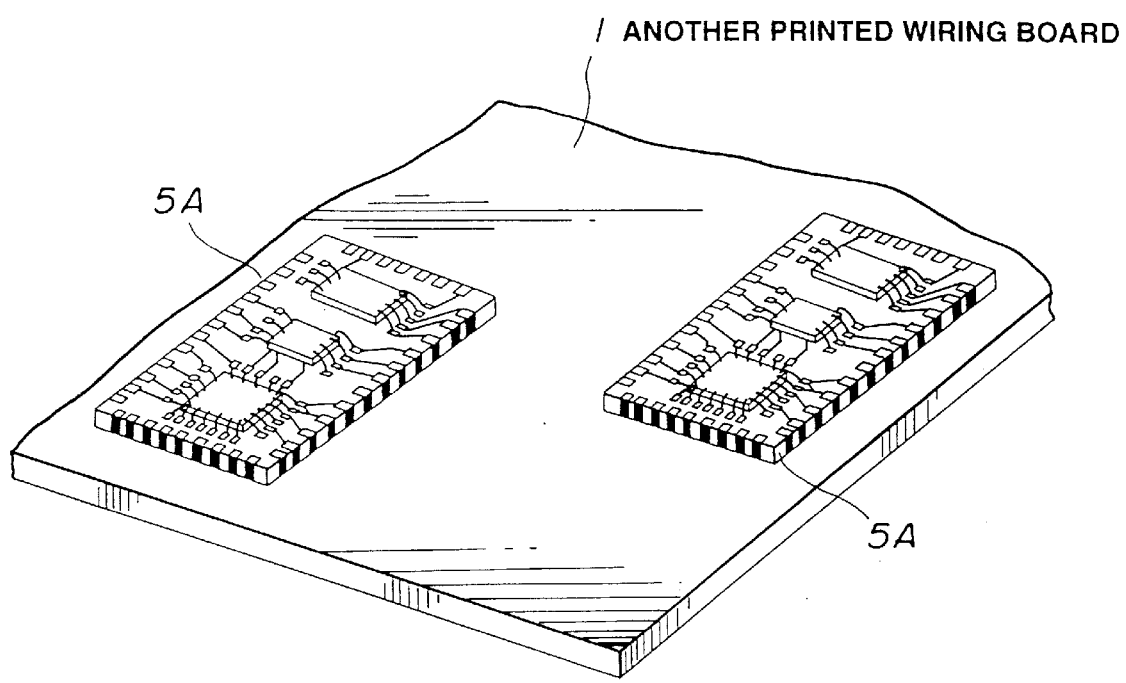
FIG. 9 is a perspective view showing how the multi-chip module of FIG. 8 is mounted on a target printed wiring board.
Figure 10:
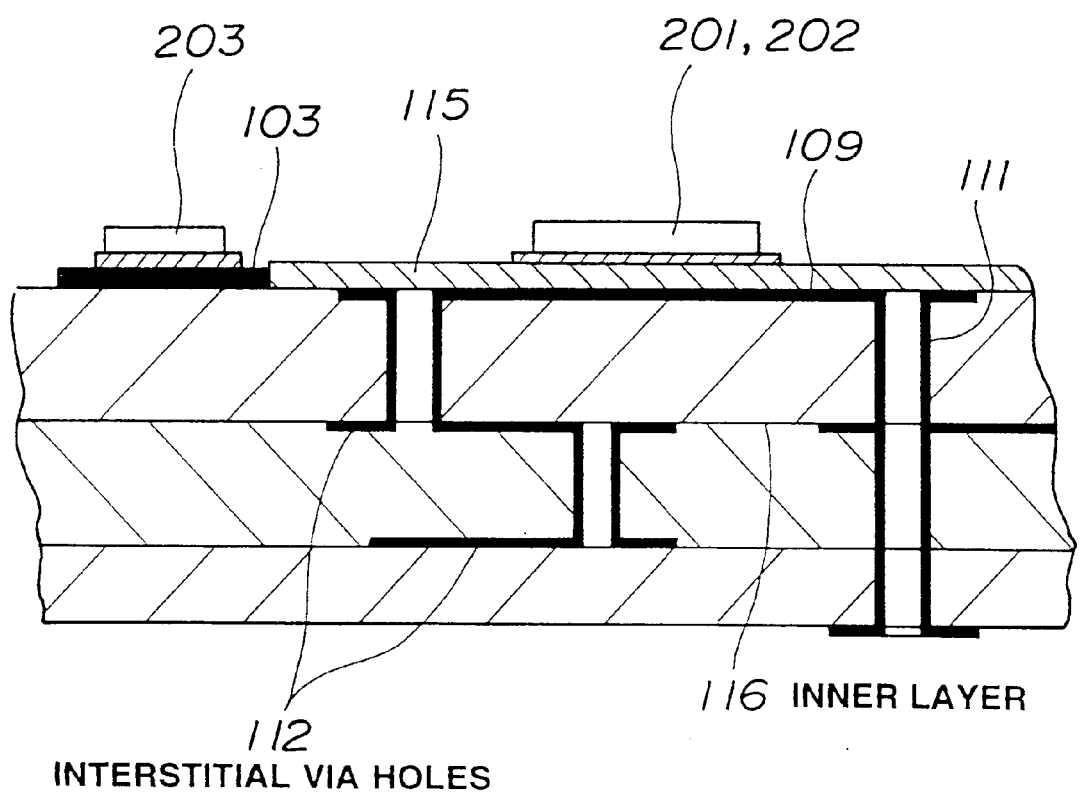
FIG. 10 is a section view of a relevant part of the multi-chip module of FIG. 8.

FIG. 7 is an exploded perspective view of a multi-chip module of a first illustrative embodiment of the invention, FIG. 8 is a perspective view of the first embodiment. FIG. 9 is a perspective view of a multi-chip module mounted on a target printed wiring board, and FIG. 10 is a section view of a relevant part of the multi-chip module of FIG. 8.

In FIGS. 7 and 8, the multi-chip module 5A of the first embodiment comprises a multi-layer printed wiring board 100 formed of, for example, ceramic material, glass epoxy material, resin material or a combination thereof, and three kinds of bare IC chips 201 through 203 mounted on the printed wiring board 100. The bare IC chips 201 through 203 is mounted respectively on the areas 101 through 103 shown in chain single-dotted lines on the surface of the printed wiring board 100.

On the edge of the printed wiring board 100, there are provided a lot of outer electrode pads 105 which are to be soldered to target printed wiring board 1 such as a mother board shown in FIG. 9. Each of the outer electrode pads 105 has a geometry in which cutting a so-called plated through hole into halves (in the longitudinal direction) results, and has a conductor layer part 105a and the other conductor layer part 105b provided around the conductor layer part 105a. Also, on the surface of the printed wiring board 100, there are disposed a lot of wire-bonding lead pads 107 so as to surround each of the areas 101 through 103.

The lead pads 107 and the outer electrode pads are interconnected via a circuit pattern 109 provided on the surface of a printed wiring board 100, and plated through holes 111 and interstitial via holes 112 formed in the printed wiring board 100.

In this case, the circuit pattern 109 on the surface of the printed wiring board 100 and conductor layers of inner layer 116 are interconnected by means of interstitial via holes 112 as shown in FIG. 10. Therefore, the quantity of the circuit pattern 109 which has to be disposed on the surface of the printed wiring board 100 can be reduced. Further, since the interstitial via holes 112 do not extend to the reverse side of the printed wiring board 100, when the multi-chip module 5A has been mounted on the target printed wiring board 1 in a later process, there is no possibility of a short circuit between the interstitial via holes 112 and the conductors of the target printed wiring board 1.

The circuit pattern 109 on the surface of the printed wiring board 100 is provided also on the inside of the areas 101 and 102, and these areas 101 and 102 are provided with solder resist (an insulating layer) 115, as the other parts of the circuit pattern 109 are. Conventionally, in the surface mounting of bare IC chips, an island is formed of a conductor layer on the printed wiring board as shown in the area 103, and a bare IC chip is mounted on the island by means of die bonding. However, in the first embodiment, the circuit pattern 109 is provided also in areas under bare IC chips 201 and 202 which do not necessarily require the earth potential of the printed wiring board 100 side.

By doing this, the quantity of the circuit pattern which has to be disposed around the bare IC chips 201 through 203 is reduced. Thus, the mounting area of the printed wiring board 100 and accordingly the size of the multi-chip module are reduced.

To the areas 101 through 103 of the printed wiring board 100, there is applied silver paste, on which the bare IC chips 201 through 203 are die-bonded. Then, as shown in FIG. 8. the electrode pads 205 of the bare IC chips 201 through 203 are bonded to the lead pads 107 of the printed wiring board 100 by wires 208, thereby completing a multi-chip module 5A After putting the completed multi-chip module 5A to a functional test by using the outer electrode pads 105, only the successfully tested multi-chip modules 5A can be mounted on the target printed wiring board 1 as shown in FIG. 9. In the surface mounting of the multi-chip module, the outer electrode pads 105 formed on the edge of the printed wiring board 100 are soldered to the target printed wiring board 1. Therefore, this means that space equivalent to only the areas of the printed wiring boards 100 has to be secured on the target printed wiring board 1 as the area necessary for mounting the multi-chip modules.

A second illustrative embodiment of the invention will be described in the following.

Figure 11:
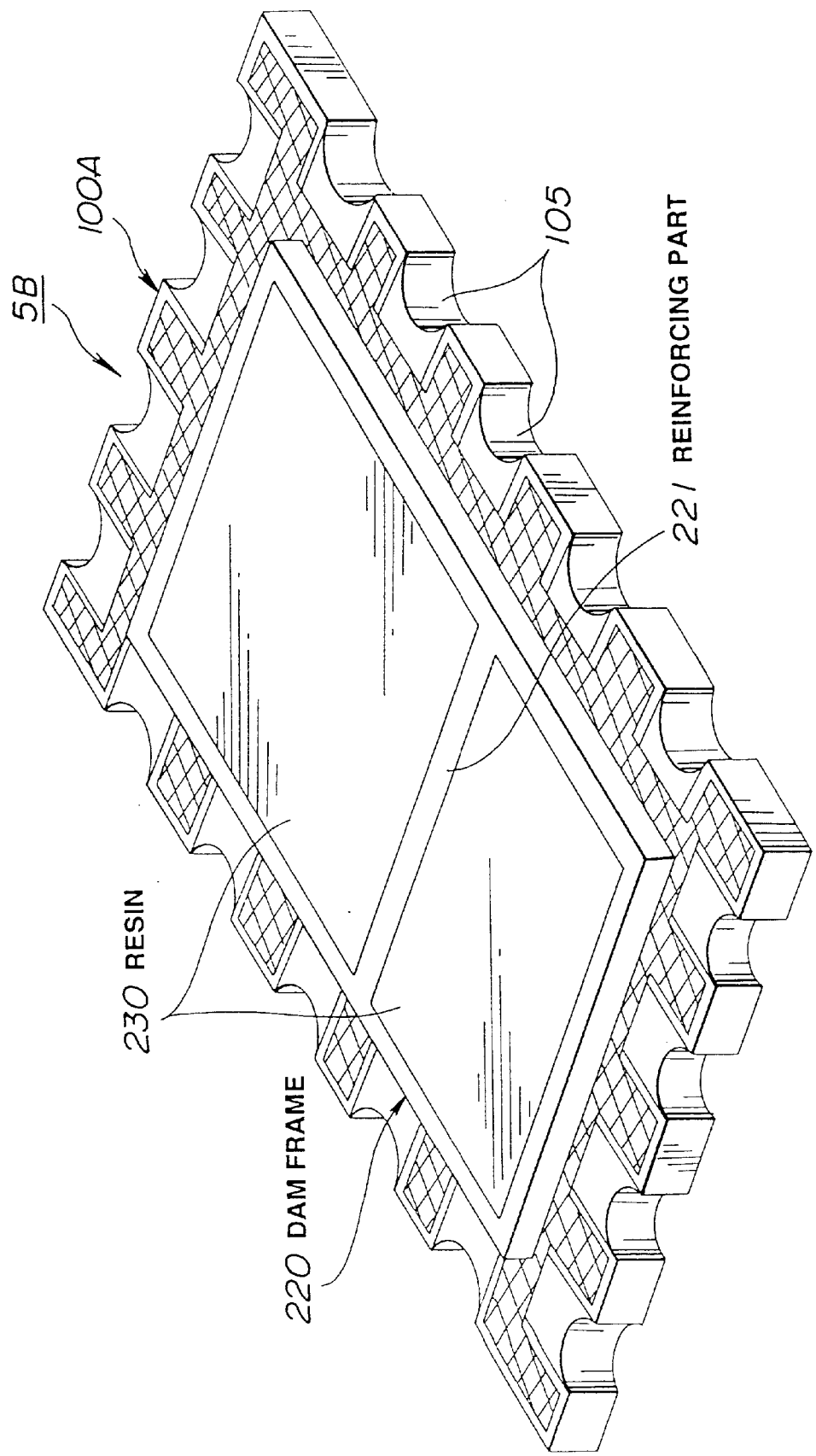
FIG. 11 is a perspective view of a multi-chip module of a second illustrative embodiment of the invention.
Figure 12:
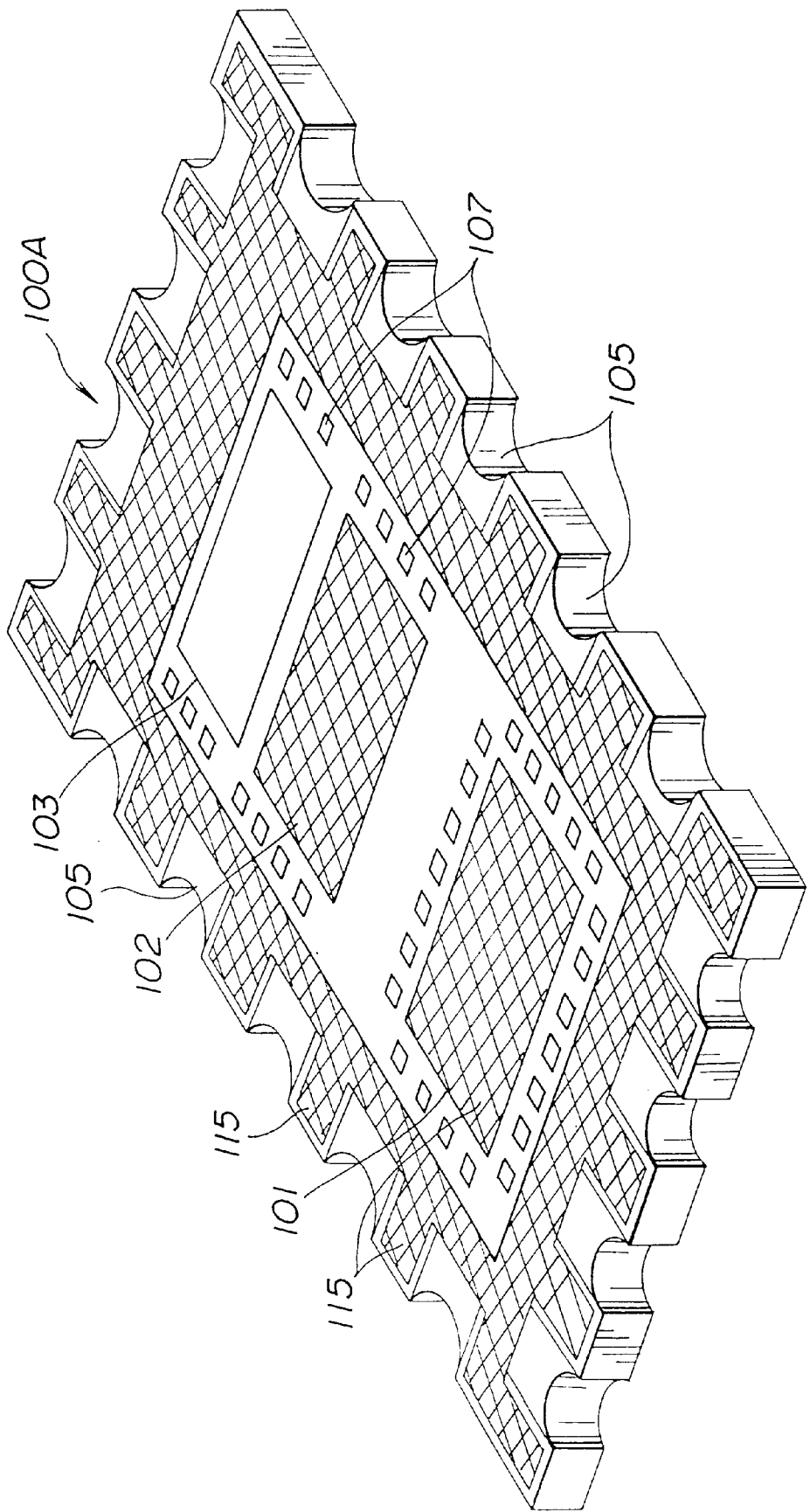
FIG. 12 is a perspective view of the printed wiring board of the multi-chip module of FIG. 11.
Figure 13:
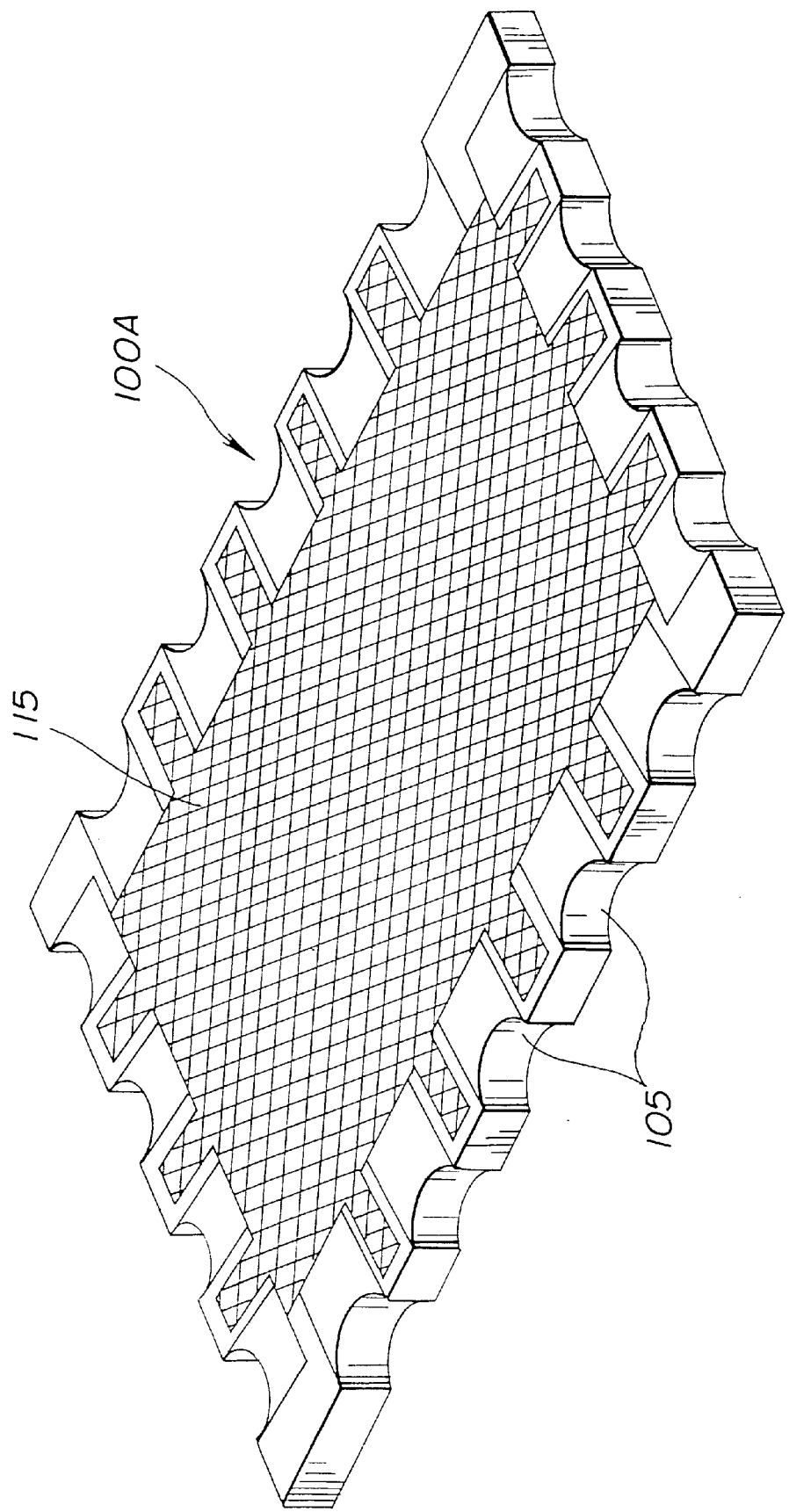
FIG. 13 is a perspective view showing the reverse side of the printed wiring board shown in FIG. 12.
Figure 14:
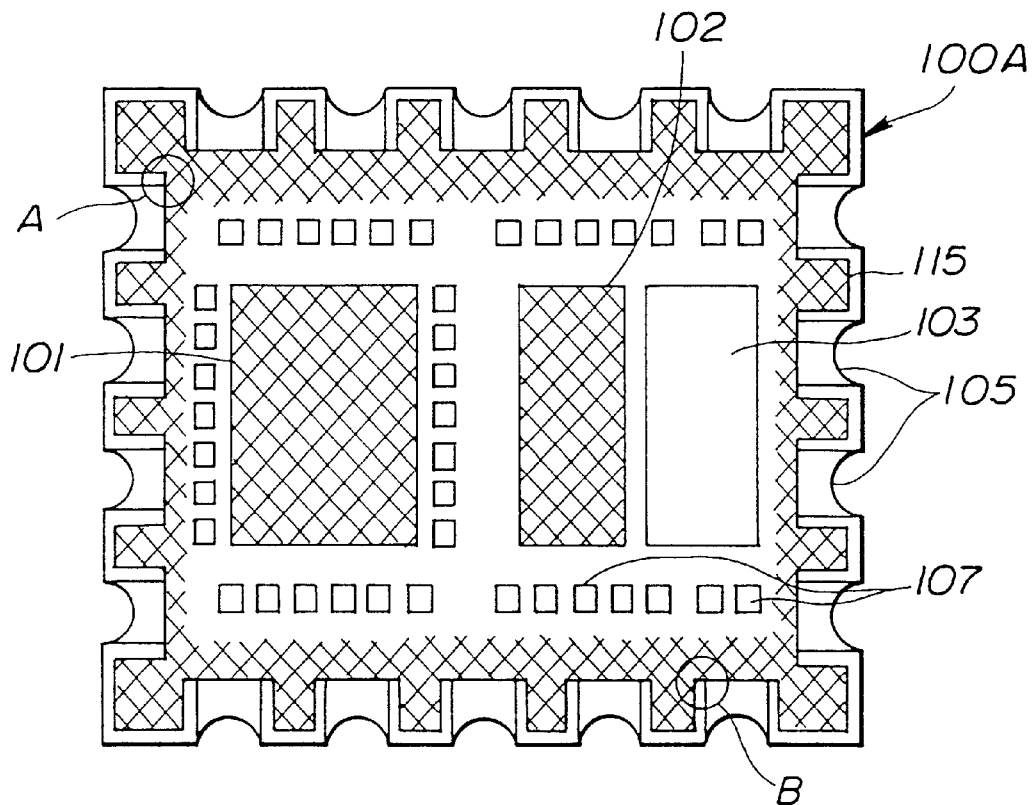
FIG. 14 is a top view of the printed wiring board of FIG. 12.
Figure 15:
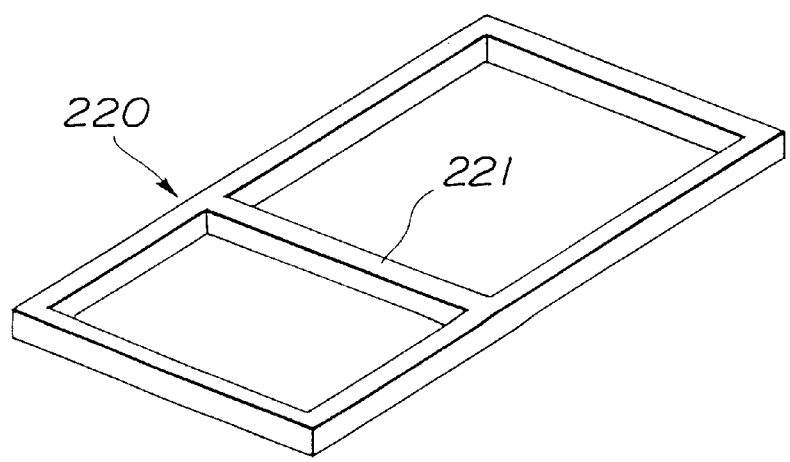
FIG. 15 is a perspective view of the dam frame of the multi-chip module of FIG. 11.
Figure 16:
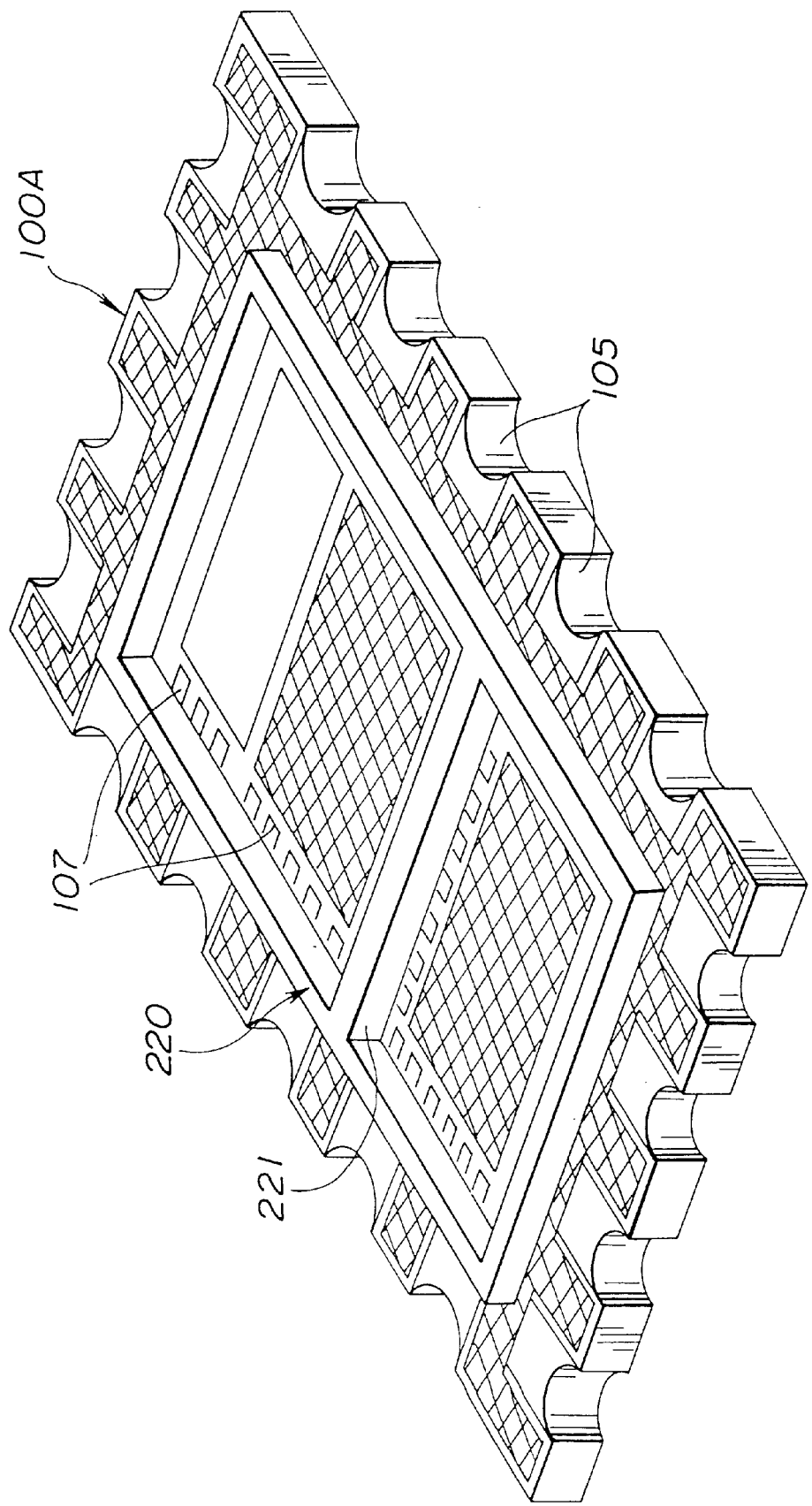
FIG. 16 is a perspective view of a printed wiring board with a dam frame.
Figure 17:
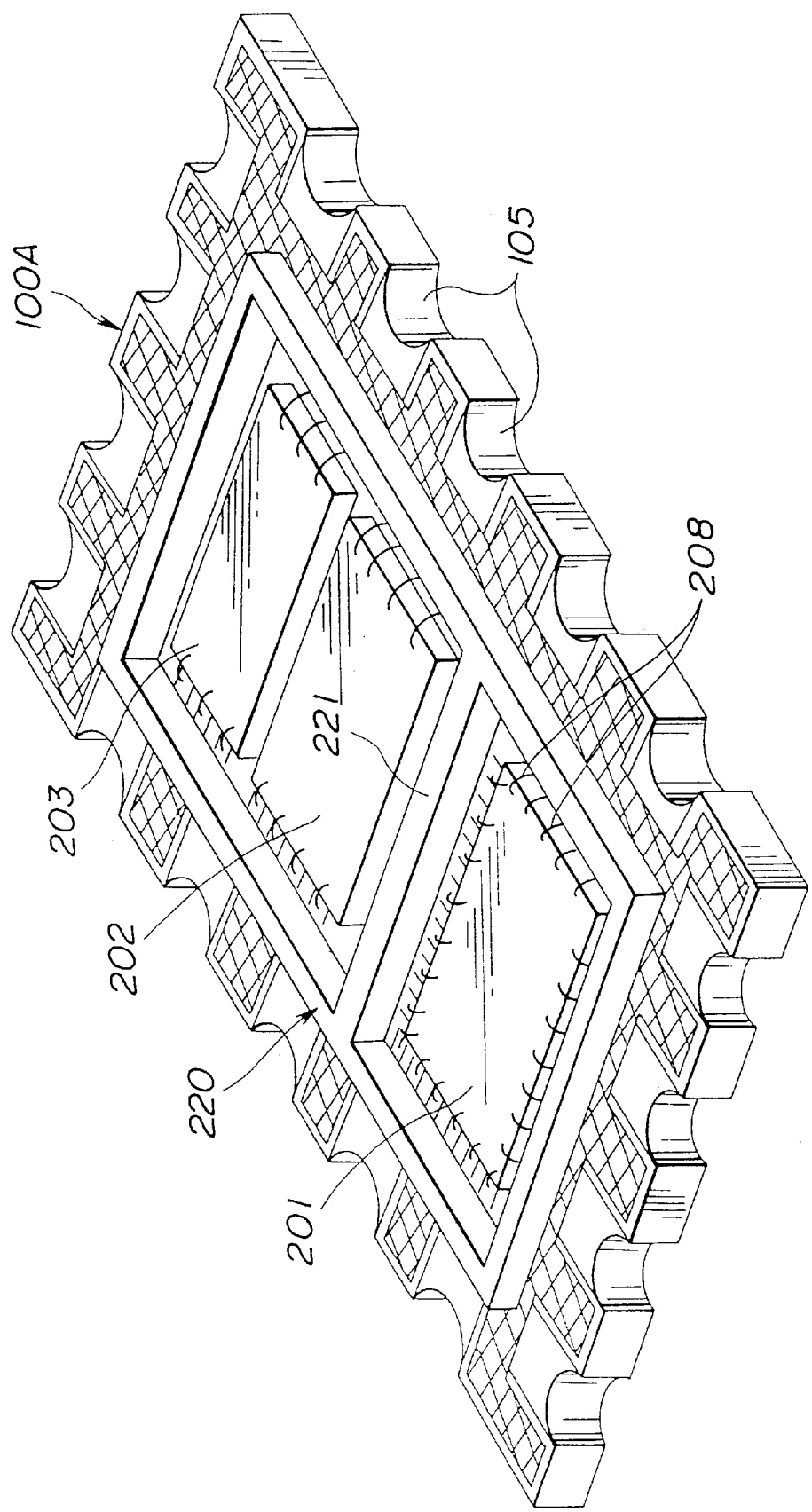
FIG. 17 is a perspective view showing a state in which bare IC chips are mounted on the printed wiring board with a dam frame.
Figure 18:
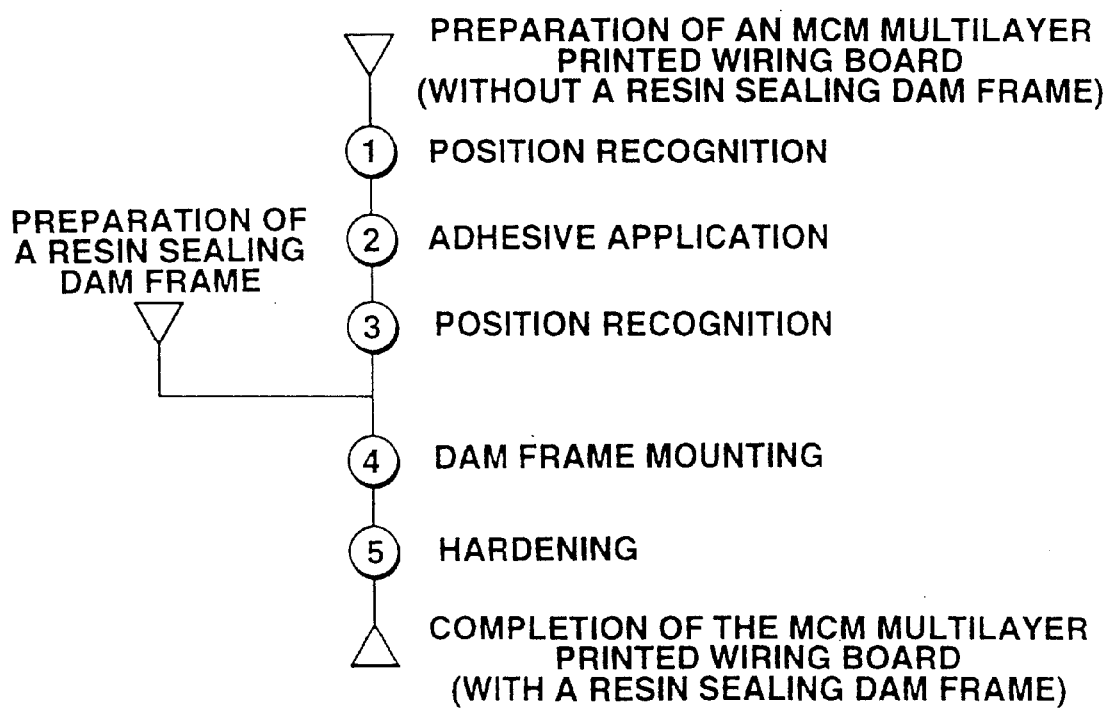
FIG. 18 is a diagram showing a manufacturing process of the printed wiring board with a dam frame.
Figure 19:
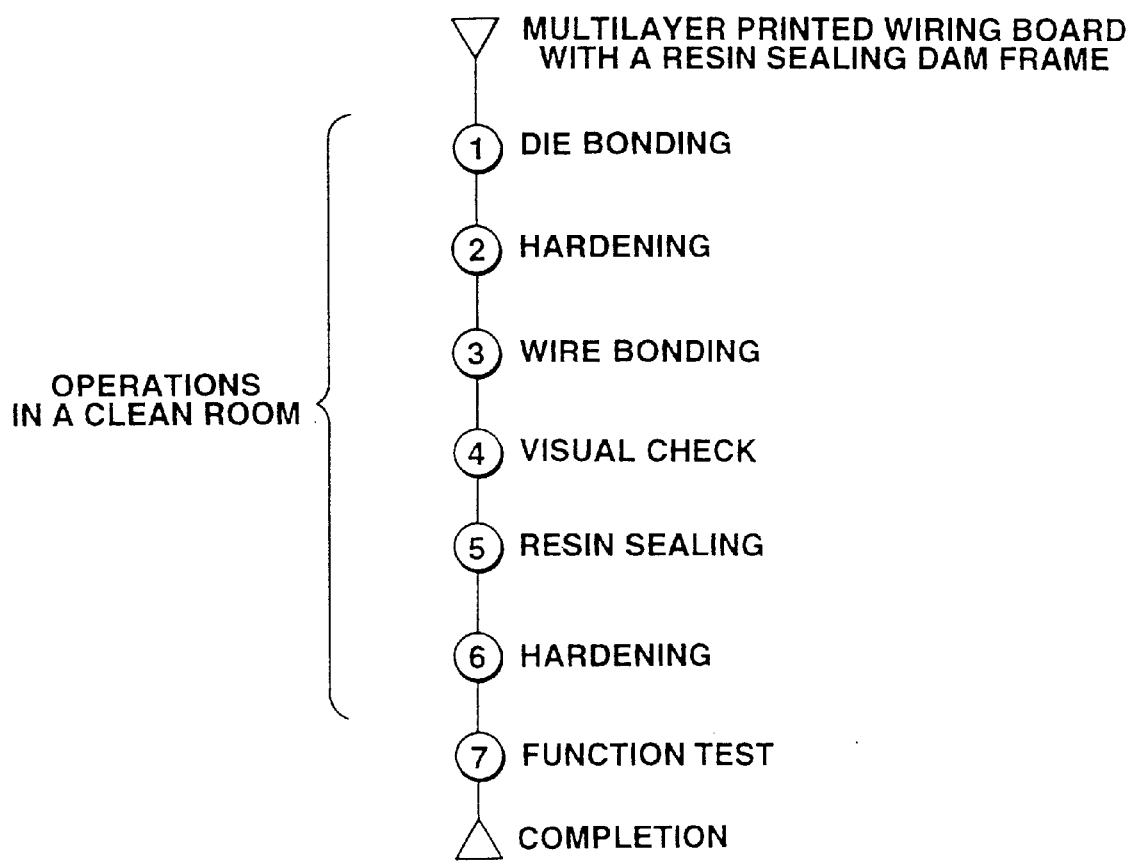
FIG. 19 is a diagram showing a process of mounting bare IC chips.
Figure 20:
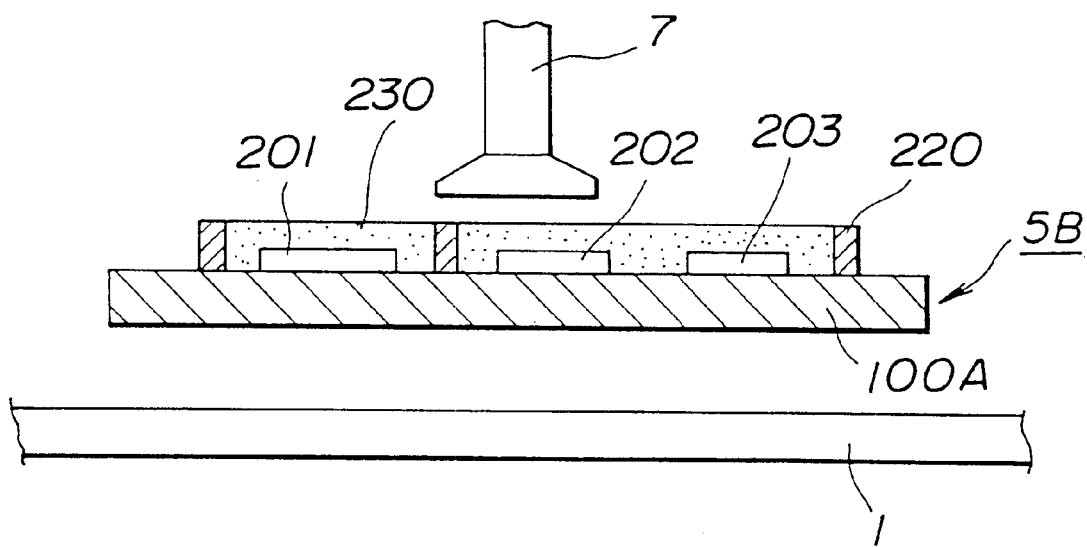
FIG. 20 is a section view showing how the multi-chip module of FIG. 17 is mounted.

FIG. 11 is a perspective view of the second illustrative embodiment, FIG. 12 is a perspective view of the printed wiring board, FIG. 13 is a perspective view showing the reverse side of the printed wiring board, FIG. 14 is a top view of the printed wiring board, FIG. 15 is a perspective view of the dam frame, FIG. 16 is a perspective view of a printed wiring board with a dam frame, FIG. 17 is a perspective view showing a state in which bare IC chips are mounted on the printed wiring board with a dam frame, FIG. 18 is a diagram showing a manufacturing process of the printed wiring board with a dam frame, FIG. 19 is a diagram showing a process of mounting bare IC chips, FIG. 20 is a section view showing how a multi-chip module is mounted.

A multi-chip module 5B according to the second embodiment of the invention comprises a multilayer printed wiring board 100A, three kinds of bare IC chips 201 through 203 mounted on the board 100A, and resin sealing dam frame 220 so disposed on the printed wiring board 100A as to enclose the bare IC chips 201 through 203 as shown in FIGS. 11 and 17. The dam frame 220 is filled with resin 230 for sealing the bare IC chips 201 through 203. The structure of the printed wiring board 100A is the same as that of the printed wiring board 100 in the first illustrative embodiment.

On the edge of the printed wiring board 100A, there are provided a lot of outer electrode pads 105 each of which has a geometry in which cutting a through hole into halves in the longitudinal direction results. Also, on the surface of the printed wiring board 100A, there are disposed a lot of wirebonding lead pads 107 so as to surround each of the mounting areas 101 through 103 for the bare IC chips 201 through 203.

The lead pads 107 and the outer electrode pads 105 are interconnected via a circuit pattern provided on the surface of a printed wiring board 100A, through holes and interstitial via holes formed in the printed wiring board 100A, and conductor layers provided on inner layers of the printed wiring board 100A. Further, a circuit pattern is disposed also in areas 101 and 102 of the printed wiring board 100A, and area 103 is an island formed of a conductor layer. On each side of the printed wiring board 100A, there is formed a solder resist pattern 115 as an insulating layer so as to cover all over except the outer electrode pads 105, the lead pads 107, and the area 103. In order to prevent solder from bridging outer electrode pads 105, the solder resist pattern 115 is formed also between the outer electrode pads 105.

As shown in FIGS. 15 through 17, the dam frame 220 for resin sealing has a rectangular shape of such a size as to be able to enclose all the bare IC chips 201 through 203 and is provided with a reinforcing part 221 so as not to cause a heat strain to occur to the printed wiring board 10A at the time of resin sealing and reflow soldering. That is, the dame frame 220 is divided into two by the reinforcing part 221.

Referring to FIGS. 18 and 19, we explain a process of attaching a dam frame 220 to the printed wiring board 100A and a process of mounting a bare IC chip in the following.

In a dam frame attaching process as shown in FIG. 18, glue is first applied to predetermined positions of the printed wiring board 100A, and the attaching to the glue-applied positions is achieved by using an automatic machine. The glue applying to the predetermined position is achieved on the basis of the peripheral portion between the two outer electrode pads (golden color) 105 located at positions on a diagonal of the printed wiring board 100A and solder resist (green) 115 parts adjacent to the two outer electrode pads 105 by identifying the color difference between the pads 105 and the solder resist parts 115 with an optical reader.

In this case, the outer electrode pads 105 is plated with gold, and the solder resist 115 has a color (e.g., green) easier to recognize than that (usually semitransparency) of the board of the printed wiring board 100A, so that the two borders can be accurately identified with an optical reader.

Next, a dam frame 220 is placed on the predetermined position to which glue has been applied on the basis of the two borders, the applied glue is hardened. Thus, the dam frame 220 is fixed to the printed wiring board 100A.

As described above, in a multi-chip module of the second embodiment, the positioning of dam frame 220 is achieved on the basis of the peripheral portion between the outer electrode pads 105 and the solder resist 115 by optically identifying the peripheral portion by the color difference. Therefore, the manufacturing process is simplified because there is no need for positioning and forming conventional positioning holes on the printed wiring board 100A.

As shown in FIG. 19, a process of mounting the bare IC chips comprises the steps of: first applying silver paste to the areas 101 through 103 of the printed wiring board 100A with a dam frame; die bonding the bare IC chips 201 through 203; hardening; wire bonding the electrode pads of the bare IC chips 201 through 203 and the lead pads 107 of the printed wiring board 100A by wires 208 (FIG. 17); sealing the bare IC chips 201 through 203 by filling the dam frame 220 with resin 230 (FIG. 11); and then making function tests.

In a multi-chip module 5B of the second embodiment, there is adopted a process of mounting the multi-chip module on the target printed wiring board 1 by absorbing the part enclosed by the dam frame 220 by using a vacuum absorber 7. In this case, the dam frame has a such a large size as to enclose the three bare IC chips 201 through 203, permitting an enough absorbing area to be secured. Also, The dam frame 220 is filled with resin 230 in such a way that the surface of the resin 220 is kept flat to a predetermined extent within a height not higher than the top of the dam frame. Therefore, the multi-chip module 5B is easily absorbed with an absorber 7.

Since the second embodiment is provided with a dam frame 220 and the dam frame 220 is filled with resin 230 for sealing the chips 201 through 203, other bare IC chips 201 through 203 can be disposed on the dame frame 220 and the resin 230. By doing this, the additional bare IC chips enable a wider variety of arrangement of a multi-chip module.

Further, it is possible to promote heat radiation from the bare IC chips 201 through 203 by forming the dam frame 220 of a metal member and using resin with a high heat conductivity. This enables the bare IC chip to effectively radiate heat which generates when the bare IC chips 201 through 203 perform, for example, power amplification. If the dam frame 220 is extended to resin 230 to enlarge the area of the dam frame 220, the heat radiation area becomes large, resulting in a more efficient heat radiation.

A third illustrative embodiment of the invention will be described in the following.

Figure 21:
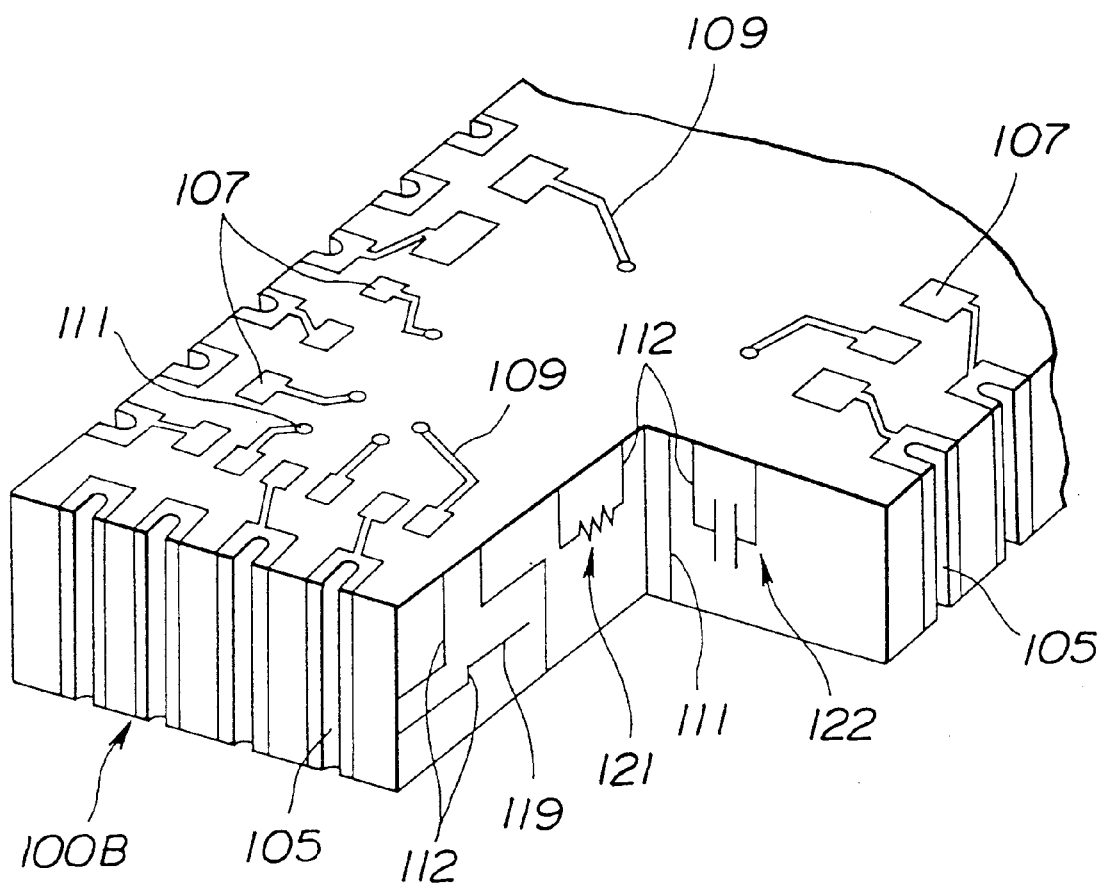
FIG. 21 is a perspective view showing, as partially cut off, a printed wiring board of a multi-chip module in a third illustrative embodiment of the invention.
Figure 22:
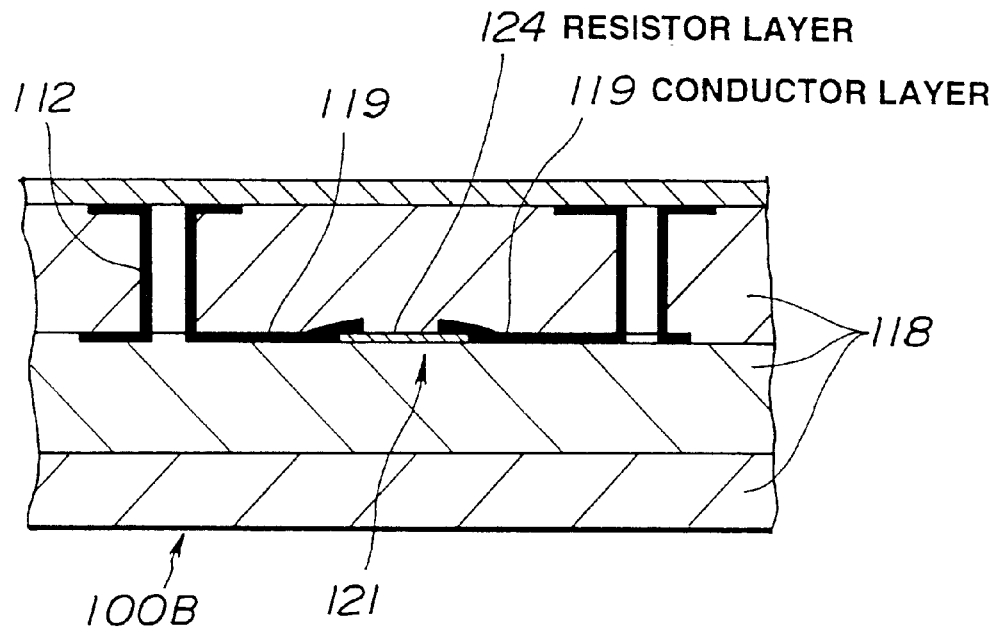
FIG. 22 is an enlarged view of a relevant part of the printed wiring board of FIG. 21.
Figure 23:
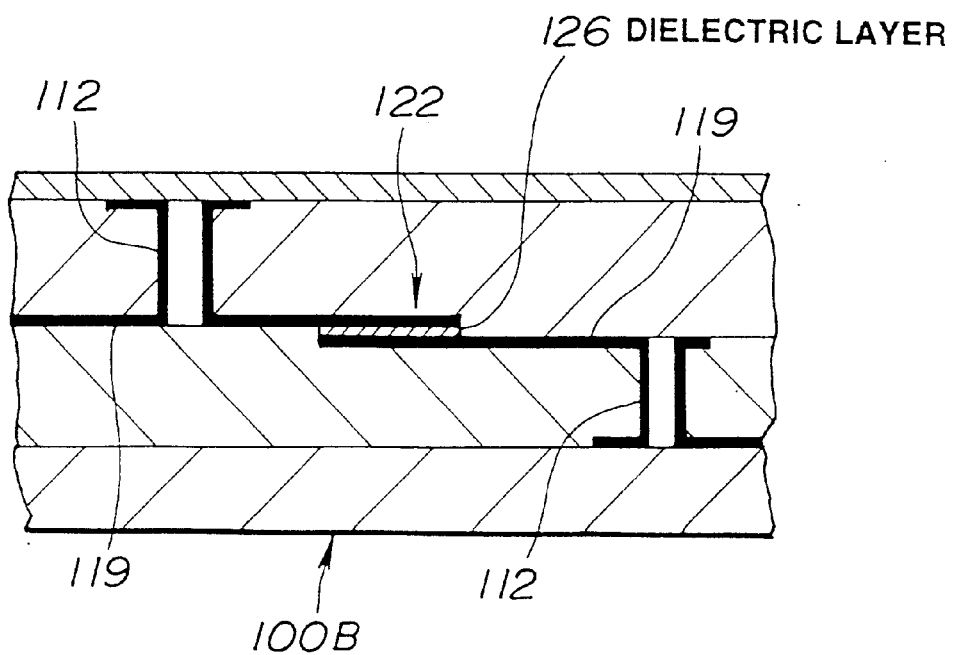
FIG. 23 is an enlarged view of another relevant part of the printed wiring board of FIG. 21.

FIG. 21 is a partially-cut-off perspective view of a printed wiring board in the third illustrative embodiment of the invention; FIG. 22 is a section view showing a part including a resistor element of the printed wiring board of FIG. 21; and FIG. 23 is a section view of a part including a capacitor of the printed wiring board of FIG. 21.

A multi-chip module according to the third embodiment of the invention is obtained by providing a multi-chip module 5A or 5B of the first or second embodiment with built-in resistors and capacitors for signal coordination with other multi-chip modules which are mounted on the same target printed wiring board 1. For this purpose, a printed wiring board 100B has a multilayer structure comprising component boards 118 formed of ceramic material, glass epoxy material, resin material, etc.

On the edge of the printed wiring board 100B of the third embodiment, there are again provided a lot of outer electrode pads 105 each of which has a geometry in which cutting a through hole into halves in the longitudinal direction results as shown in FIG. 21. Also, on the surface of the printed wiring board 100B, there are disposed a lot of lead pads 107 so as to surround each of the mounting areas for the bare IC chips 201 through 203. The lead pads 107 and the outer electrode pads 105 are interconnected via a circuit pattern provided on the surface of a printed wiring board 100B, through holes 111 and interstitial via holes 112 formed in the printed wiring board 100B, and conductor layers 119 provided on inner layers of the printed wiring board 100B.

Further, resistor elements 121 and capacitors 122 are formed in the inside of the printed wiring board 100B. Each resistor element 121 is realized by forming a resistor element (resistor layer) 124 on a component board 118 by means of, e.g., screen printing, and connecting both ends of the resistor element to conductor layers 119 constituting an inner layer as shown in FIG. 22. Each capacitor 122 is formed by printing a dielectric layer 126 on one conductor layer 119, and laminating another component layer 118 so as to put the dielectric 126 layer between the one conductor layer 119 and the other conductor layer 119 on the another component layer 118 as shown in FIG. 23. It is noted that the conductor layer 119 connected to these resistor elements or capacitors 122 are connected to lead pads 107 and outer electrode pads 105 via interstitial via hole 112, the circuit pattern 109, etc. Also, Ag—Pd paste, Rh-oxide paste, etc. are used for the resistor elements 124, and barium titanate-crystallized glass etc. is used for dielectric layer 126.

Thus, in the third embodiment, resistor elements 121 and capacitors 122 are disposed within the printed wiring board 100B. Resistor elements and capacitors can be built in a multi-chip module without increasing the size of the multi-chip module.

A fourth illustrative embodiment of the invention will be described in the following.

Figure 24:
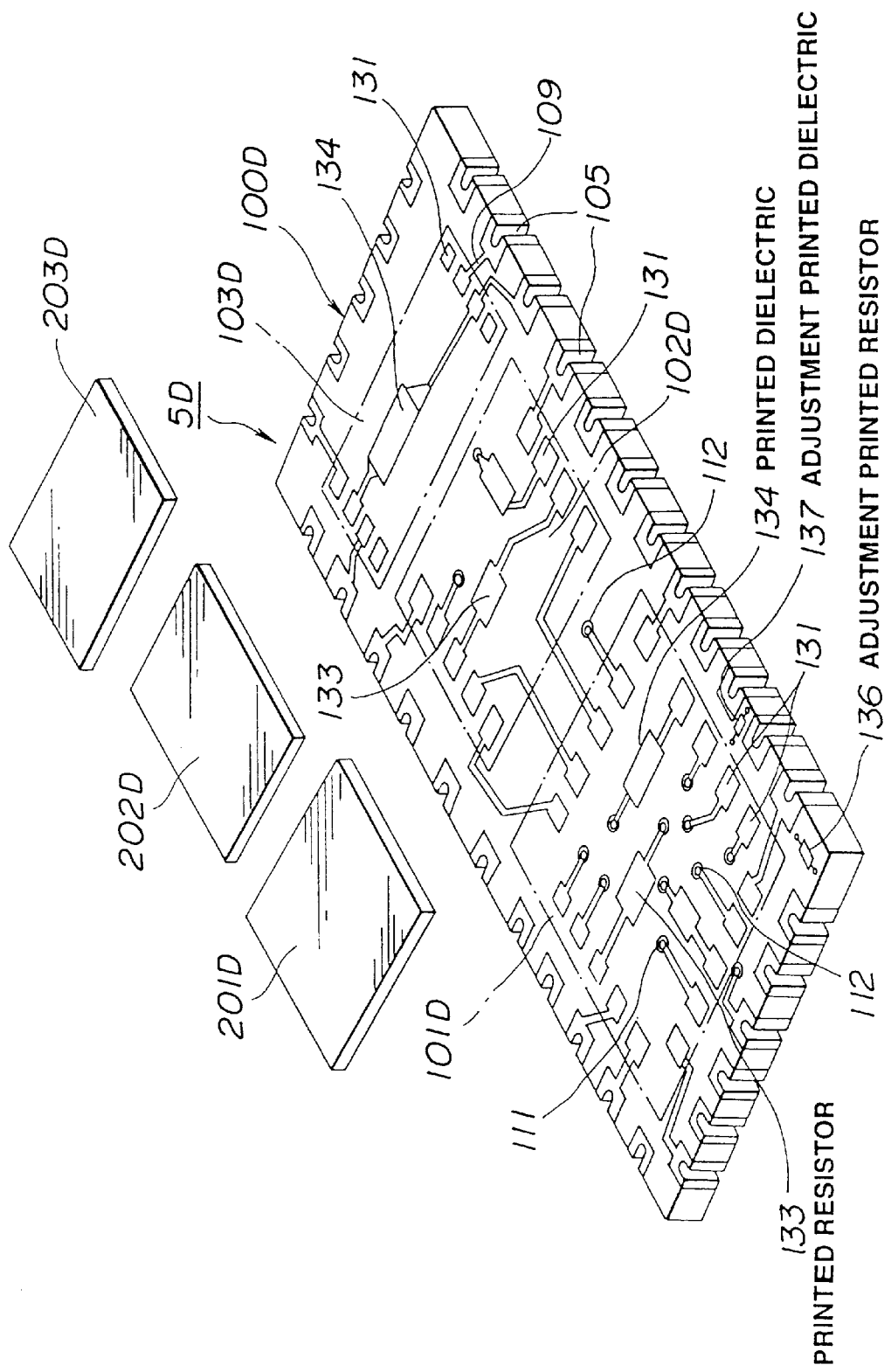
FIG. 24 is an exploded perspective view of a multi-chip module of a fourth illustrative embodiment of the invention.
Figure 25:
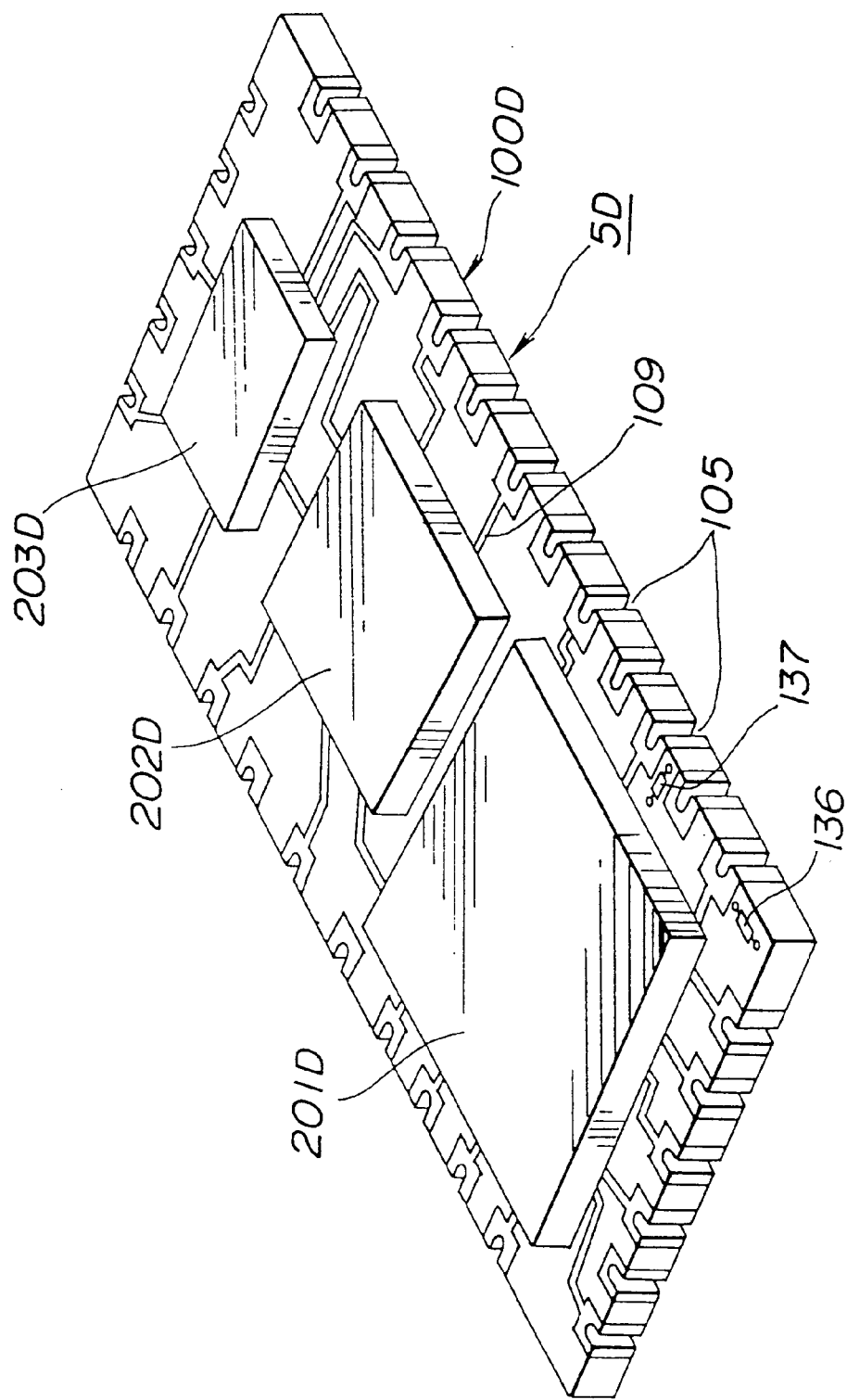
FIG. 25 is a perspective view of an assembled state of the multi-chip module of FIG. 24.

FIG. 24 is an exploded perspective view of a multi-chip module of a fourth illustrative embodiment of the invention; FIG. 25 is a perspective view of the multi-chip module of FIG. 24; and FIG. 26 is a perspective view of a state in which the multi-chip modules of FIG. 25 are mounted on the target printed wiring board.

A multi-chip module 5D of the fourth embodiment is obtained by mounting a plurality of bare IC chips on the surface of a printed wiring board by means of flip chip bonding.

The multi-chip module 5D comprises a multilayer printed wiring board 100D and three kinds of bare IC chips 201D through 203D which are mounted on the board 100D. The bare IC chips 201D through 203D are mounted on areas 101D through 103D shown in chain single-dotted lines on the surface of the printed wiring board 100D, respectively.

Figure 26:
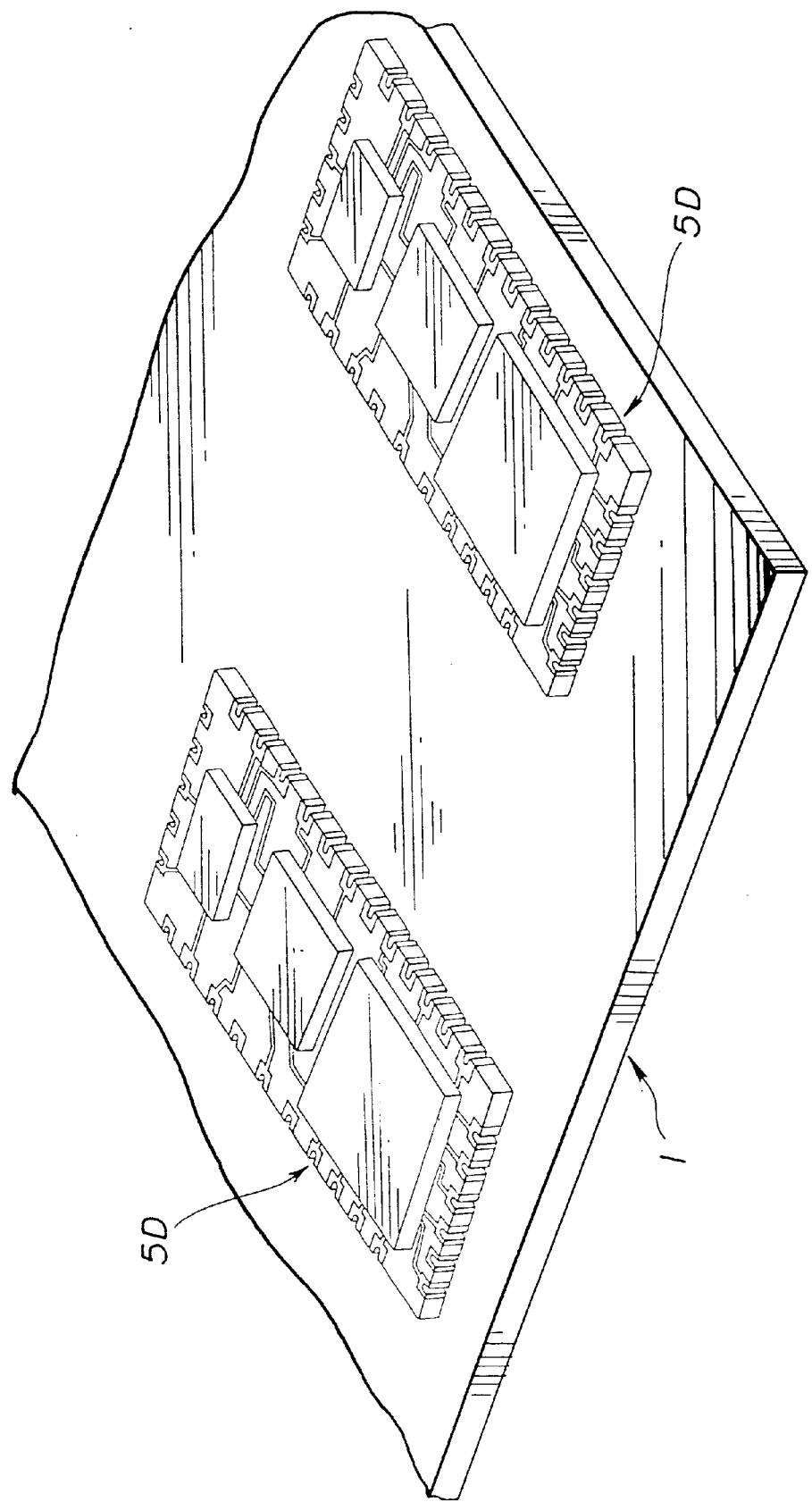
FIG. 26 is a perspective view of a state in which the multi-chip modules of FIG. 25 are mounted on a target printed wiring board.

On the edge of the printed wiring board 100D of the third embodiment, as in the printed wiring board 100, there are again provided a lot of outer electrode pads 105 which are to be soldered to the target printed wiring board 1 shown in FIG. 26. On the other hand, a lot of flip chip bonding pads 131 are provided in the areas 101D through 103D on the surface of the printed wiring board 100D.

These pads 131 and the outer electrode pads 105 are interconnected via a circuit pattern 109 provided on the surface of a printed wiring board 100D, printed resistor elements 133, printed dielectric 134, through holes 111 and interstitial via holes 112 formed in the printed wiring board 100D.

As in the first embodiment, in the fourth embodiment, the circuit pattern 109 on the surface of the printed wiring board 100D and inner layer conductors are interconnected via interstitial via holes 112. Therefore, the quantity of the circuit pattern 109 which has to be disposed on the surface of the printed wiring board 100D is reduced. Further, in the fourth embodiment, the printed resistor elements 133 and the printed dielectric 134 are provided right under the bare IC chips 201D through 203D to be flip chip bonded, that is, on the areas 101D through 103D, respectively.

By doing this, chip resistor elements and chip capacitors which had to be conventionally provided around the IC chips can be reduced in number. Thus, the size of the multi-chip module can be reduced. Additionally, after forming the printed resistor elements 133 and the printed dielectrics 134 on the printed wiring board 100D, a solder resist pattern 115 is formed on the surface of the printed wiring board 100D excluding the parts for the flip chip bonding pads 131 and the outer electrode pads 105.

Printed resistor elements 136 and printed dielectrics 137 permitting trimming for adjustment is provided outside the areas 101D through 103D on the surface of the printed wiring board 100D. Specifically in a high frequency circuit dealing with a high frequency. printed resistor elements and printed capacitors may have to be finely adjusted in order to set the tuning frequency for a predetermined center frequency or match the characteristic frequency. Since such a fine adjustment is not possible if the printed resistor elements or the printed dielectrics are formed in inner layers or under the bare IC chips, printed resistor elements 136 and printed dielectrics 137 permitting trimming for adjustment is provided on the surface of the printed wiring board 100D.

The bare IC chips 201D through 203D are bonded to the pads 131 of the area 101D through 103D on the printed wiring board 100D by means of flip chip bonding to form a multi-chip module 5D. Since there is no need for providing bonding pads around the bare IC chips in case of flip chip bonding, the size of multi-chip module can be made smaller than in case of wire bonding.

As in case of the first embodiment, after putting the multi-chip module 5D to a functional test by using the outer electrode pads 105, only the successfully tested multi-chip modules 5D are mounted on the target printed wiring board 1 as shown in FIG. 26.

In the surface mounting of the multi-chip module 5D, the outer electrode pads 105 formed on the edge of the printed wiring board 100D are soldered to the target printed wiring board 1. Therefore, this means that space equivalent to only the areas of the printed wiring boards 100D has to be secured on the target printed wiring board 1 as the area necessary for mounting the multi-chip modules as in case of the first embodiment.

Printed conductors constituting inductance may be formed together with printed resistor elements and printed dielectrics (capacitors) in the third or fourth embodiment. By doing this, it is possible to form an oscillator and tuning circuit for processing a high frequency signal.

It should be noted that though each outer electrode pad 105 has a geometry in which cutting a through hole longitudinally into halves results in the first illustrative embodiment, through holes 106a themselves may be provided along the edge of the printed wiring board 100, and these through holes may be used as outer electrode pads. In this case, if the peripheries of the printed wiring board 100 may contact any metal member, a short circuit between any of the outer electrode pads and the metal member can be avoided. This arrangement is also applicable to the second through fourth embodiments.

Figure 27:
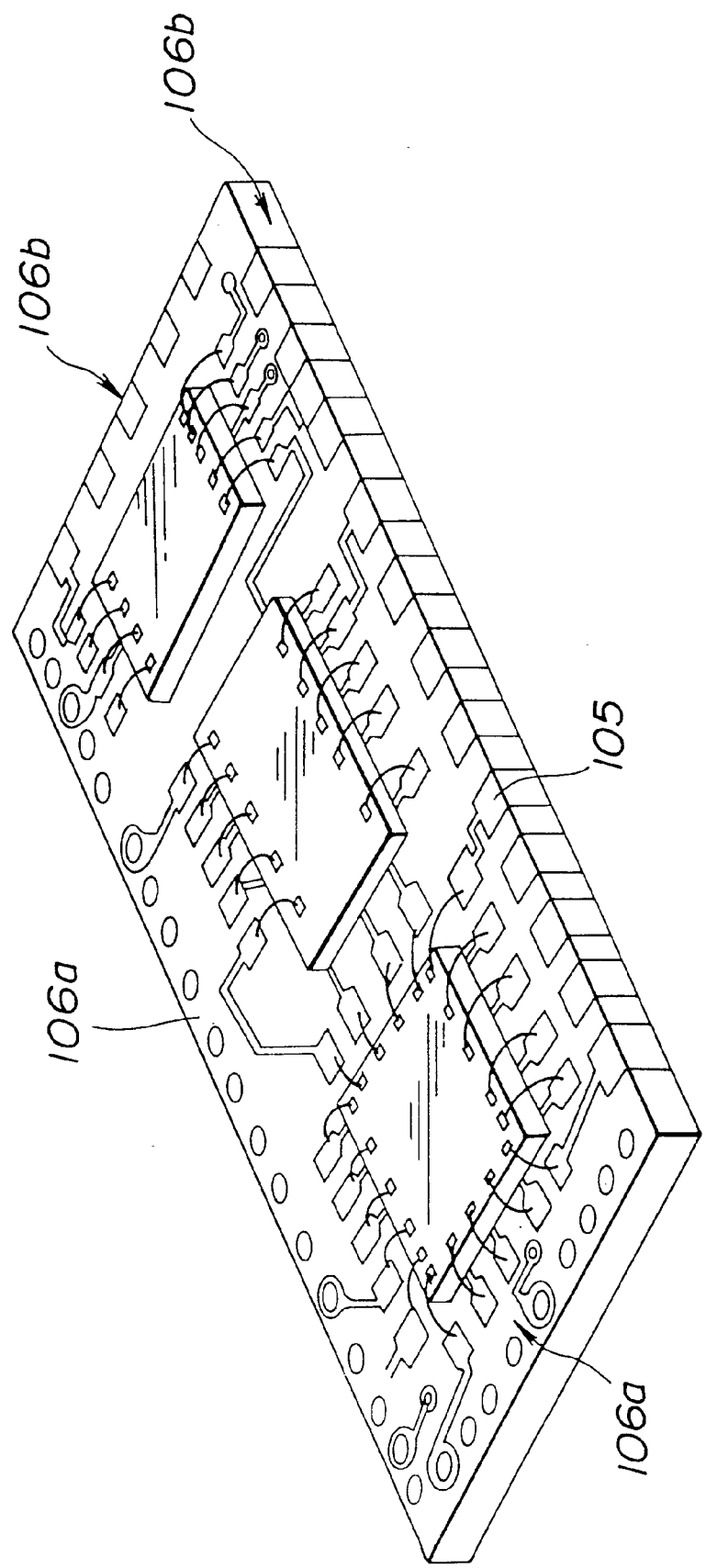
FIG. 27 is a perspective view of an exemplary modification of outer electrode pads.

Instead of outer electrode pads 105 with a geometry in which cutting a through hole longitudinally into halves results, there may be provided patterns 106b in each of which the land of the outer electrode pad is extended to the end and across the end surface of the printed wiring board 100 as shown in FIG. 27, and each pattern 106b may be connected to the target printed wiring board 1, which also simplifies the mounting process.

Figure 28:
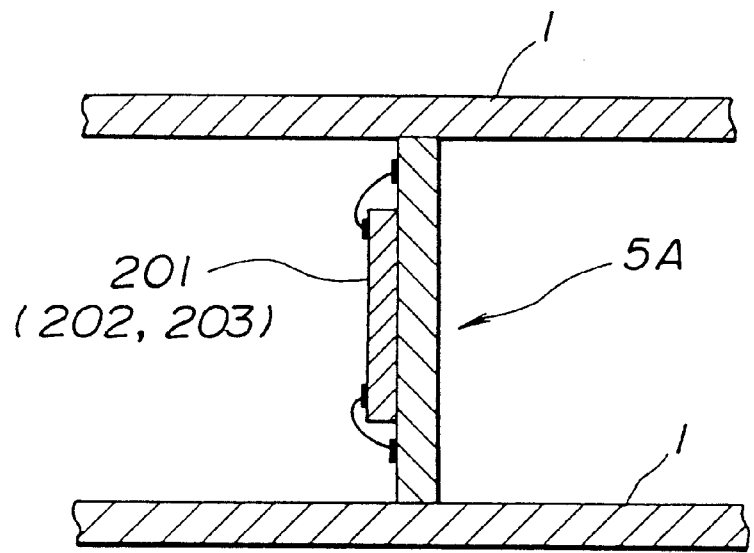
FIG. 28 is a section view showing a state in which a multi-chip modules according to the exemplary modification are mounted on a target printed wiring board.
Figure 29:
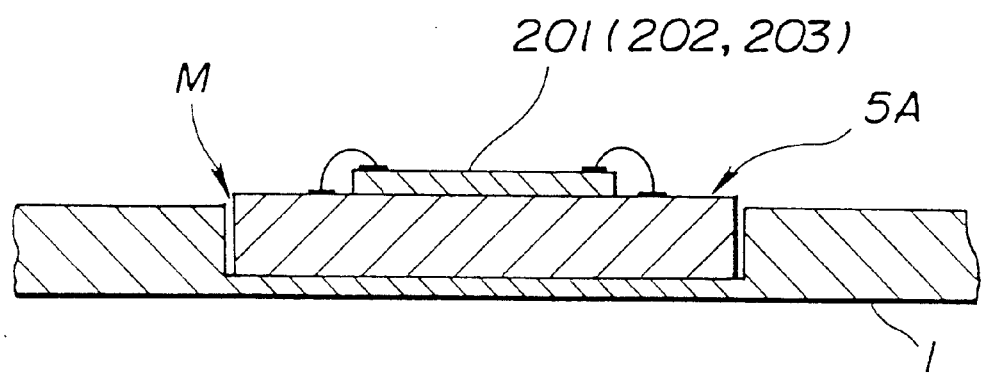
FIG. 29 is a section view showing another modification of the embodiment, that is, another state in which a multi-chip modules is mounted on a target printed wiring board.

Though in the first embodiment a multi-chip module is disposed in parallel to the target printed wiring board 1 as shown in FIG. 9, the multi-chip module may be disposed for connection in perpendicular to the target printed wiring board 1 as shown in FIG. 28. Alternatively, the multi-chip module may be disposed between and in perpendicular to two other printed wiring boards 1 disposed in parallel to each other. Thus, the degree of freedom in the disposition of multi-chip module is enhanced.

Also, a multi-chip module 5A is put on the target printed wiring board 1 in the first embodiment. while a hole or a concavity M being provided in the target printed wiring board 1, a multi-chip module may be inserted in the hole or the concavity M. In this case, the thickness of the target printed wiring board can be reduced. Similarly, holes or concavity being provided in the printed wiring board, the bare IC chips may be inserted in the holes or the concavities. This arrangement is also applicable to the second through fourth embodiments. In this case, the thickness of the target printed wiring board can be reduced.

Though in the first embodiment the electrode pads 205 of the bare IC chips 201 through 203 and the lead pads 107 of the printed wiring board are interconnected via wires 208 by means of wire bonding, some of the electrode pads 205 of the bare IC chips 201 through 203 may be directly connected to outer electrode pads 105 via wires 208 without providing the corresponding lead pads 107 depending on the electrical arrangement. Doing this also contributes to the simplification of printed wiring board 100. This may be applied to the third and the fourth embodiments.

Figure 30:
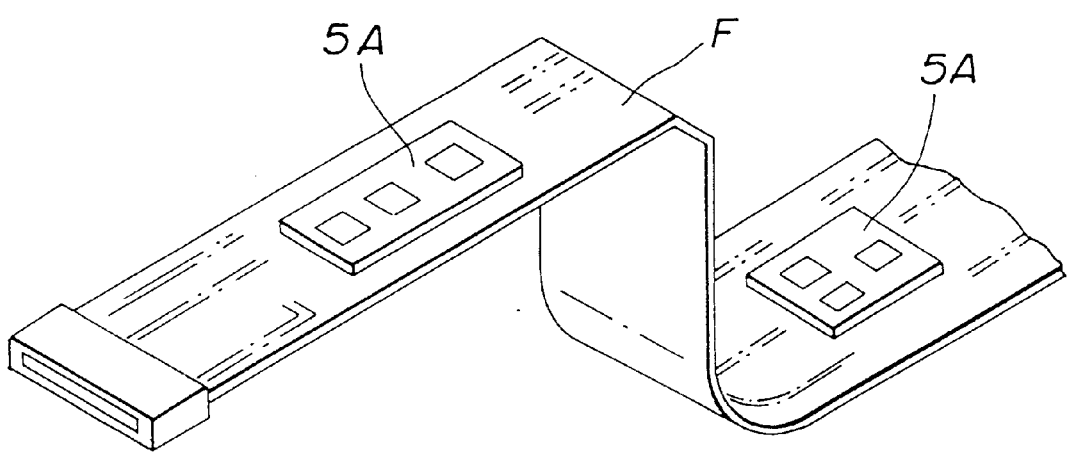
FIG. 30 is a perspective view of a state in which a multi-chip modules is mounted on a flexible wiring board.
Figure 31:
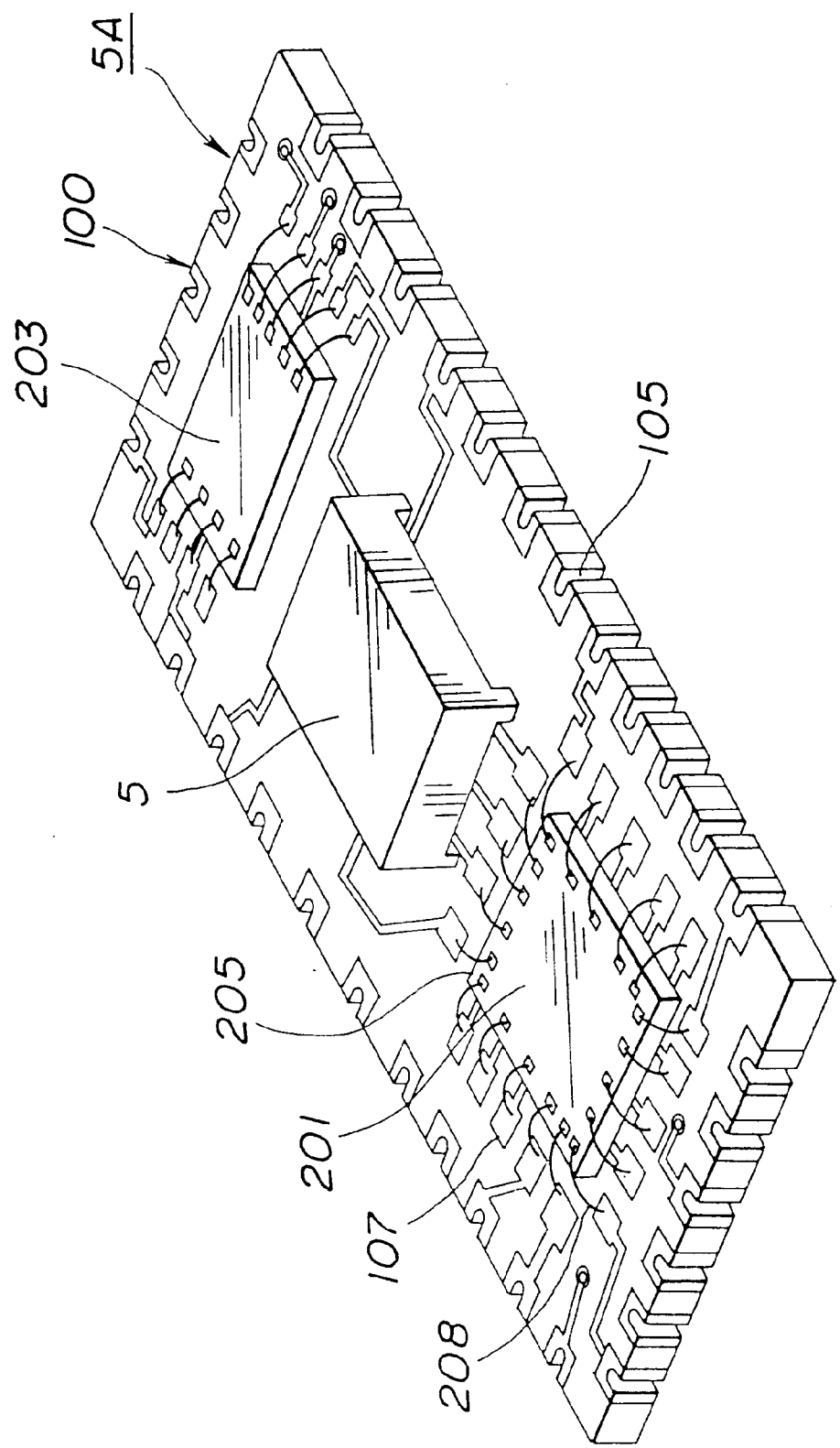
FIG. 31 is a perspective view showing an exemplary modification in which a bare IC chip is magnetically shielded by covering the bare IC chip with a conductive covering member.
Figure 32:
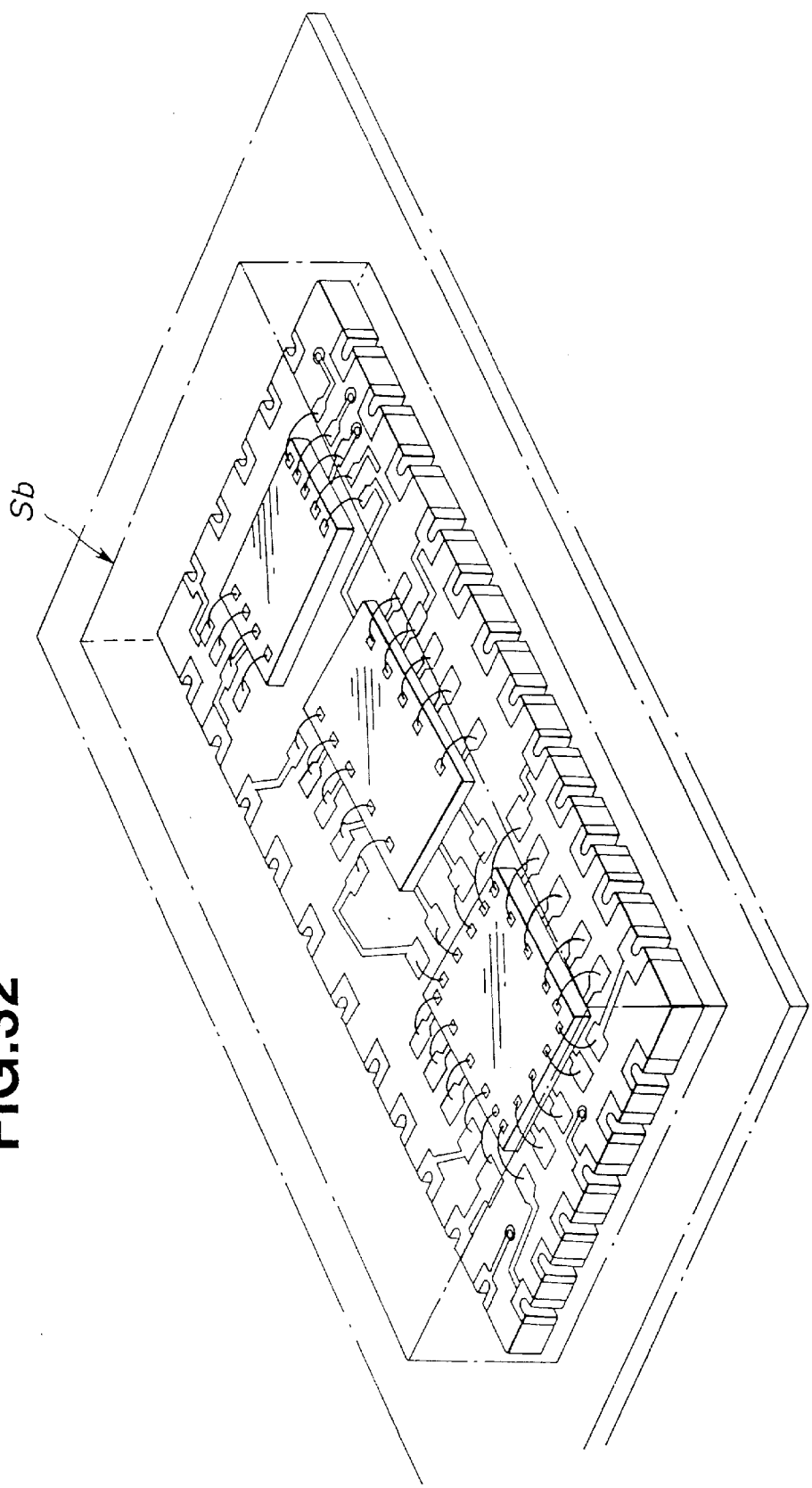
FIG. 32 is a perspective view showing another exemplary modification in which the entire multi-chip module is magnetically shielded by covering the module with a conductive covering member.

If a flexible wiring board F is used for the target printed wiring board 1 as shown in FIG. 30, multi-chip modules can be disposed in three dimensions. Furthermore, a multi-chip module may be covered with a cover Sa of conductive material (metal or conductive resin) to shield the multi-chip module electromagnetically as shown in FIG. 31. Alternatively, the multi-chip modules may be covered with a cover Sb of conductive material (metal or conductive resin) to electromagnetically shield the multi-chip modules as a whole as shown in FIG. 32.

Though the present invention has been described in terms of some illustrative embodiments, it is apparent to those of ordinary skill in the art that other various arrangements may be constructed without departing from the spirit and scope of the present invention. It should be therefore understood that the present invention is not limited to the specific embodiments described in the specification, but rather be construed broadly within its spirit and scope as defined by elements set out in the appended claims.

As described above, in a multi-chip module according to any of the 1st, 5th, 7th, 9th, 11th, 12th, 16th, 22nd, 23rd and 28th aspects of the invention, the geometry of each outer electrode pad which cutting a through hole in the longitudinal direction yields for soldering the multi-chip module to the target printed wiring board, outer electrode pads each comprising a through hole provided on the margin, outer electrode pads extending from the margin and across the end face, or the direct connection between the bare IC chips and the outer electrode pads by means of wire bonding eliminates the need of providing the margin of the printed wiring board with lead terminals as is done in conventional multi-chip modules. Therefore, the packaging density of electronic components in the target printed wiring board is raised, and the working process can be reduced.

In a multi-chip module according to any of the 2nd, 5th, 7th, 9th, 11th, 12th and 16th aspects of the invention, a circuit pattern is disposed in areas on the printed wiring board where bare IC chips are mounted, resulting in a reduction of the circuit pattern which is to be provided around the bare IC chips. The size of printed wiring board can be reduced accordingly.

In a multi-chip module according to any of the 3rd, 5th, 7th, 9th, 11th, 12th and 16th aspects of the invention, the circuit pattern which is to be provided around the bare IC chips is reduced because there is no need for providing the lead terminals as in the multi-chip modules of the 1st or 2nd aspect of the invention.

In a multi-chip module according to any of the 4th, 5th, 7th, 9th, 11th, 12th, 16th and 29th aspects of the invention, there is no need for providing chip resistor elements, chip capacitors or inductors around the bare IC chips because resistor elements, capacitors and inductors can be formed on the areas, on the printed wiring board. where the bare IC chips are mounted. Therefore, the invention has the effect of reduce the size of printed wiring board accordingly.

In a multi-chip module according to any of the 6th, 7th, 9th, 11th, 12th, 16th and 35th aspects of the invention, the bare IC chips are electrically interconnected via interstitial via holes and inner conductor layers provided within a multilayer structure formed of ceramic material, glass epoxy material, and/or resin material. Therefore, the circuit pattern which has to be provided around the bare IC chips is reduced, and the printed wiring board can be nimiaturized accordingly.

In a multi-chip module according to any of the 8th, 9th and 16th aspects of the invention, since resistor elements can be formed within the printed wiring board, there is no need for providing chip resistor elements on the surface of the printed wiring board, which can be miniaturized accordingly.

In a multi-chip module according to any of the 10th, 11th and 16th aspects of the invention, since capacitors can be formed within the printed wiring board, there is no need for providing chip capacitors on the surface of the printed wiring board, which can be miniaturized accordingly.

In a multi-chip module according to any of the 12th, 13th and 16th aspects of the invention, since resistor elements, capacitors, and inductors are formed within the printed wiring board, there is no need for providing chip resistor elements, chip capacitors, and inductors on the surface of the printed wiring board, which can be miniaturized accordingly.

In a multi-chip module according to any of the 14th, 16th and 29th aspects of the invention, there is provided printed resistor elements, printed dielectrics and printed inductors, which has effects of not only any of the 1st through 13th aspects of the invention but also permitting a fine adjustment of operational characteristics of the circuit by removing a part of the printed resistor elements, the printed dielectrics and the printed inductors. For example, this has the effect of facilitating and ensuring the adjustment for matching the characteristic in high frequency operation to a predetermined characteristic.

In a multi-chip module according to any of the 15th, 16th and 25th aspects of the invention, since a single dam frame encloses a plurality of bare IC chips, there is no need for providing each bare IC chip with a dam frame, which not only reduces the area occupied by the dam frames, but also facilitates and ensures the process of carrying the multi-chip module by absorbing the top face enclosed by the dam frame.

A multi-chip module according to the 17th aspect of the invention has not only the effect of 15th or 16th aspect of the invention but also the effect of reducing a strain caused by heat at the time of resin sealing and reflow soldering because the dam frame is provided with a reinforcing part. Thus, operations are facilitated.

Since in a multi-chip module according to the 18th aspect of the invention the dam frame is mounted on the printed wiring board being positioned on the basis of the boundary between the electrode pads and the surrounding area, there is no need for providing the printed wiring board with holes in which the dam frames are mounted, as in case of the 15th through 17th aspects of the invention. This raises the degree of freedom in the arrangement of circuit pattern, and accordingly contributes to the miniaturization of printed wiring board.

In a multi-chip module according to the 19th aspect of the invention, the boundary between the electrode pads (e.g., golden color) and solder resist (e.g., green) provided adjacently to the electrode pads for preventing the solder from bridging electrode pads is used as a reference position for dam frame mounting. The color difference makes the boundary more clear, insuring the identification of the boundary by an optical, identification device, and resulting in an enhancement of the working efficiency.

In a multi-chip module according to the 20th aspect of the invention, since the surface of the resin filling the dam frame enclosing a plurality of bare IC chips is not higher than the dam frame, the area enclosed by the dam frame can be easily absorbed by a vacuum absorber, resulting in an enhancement of the working efficiency.

In a multi-chip module according to the 21st aspect of the invention, since the bare IC chips are mounted on the printed wiring board by means of flip chip bonding, there is no need for disposing bonding pads around the bare IC chips on the surface of the printed wiring board, which car be miniaturized accordingly.

In a multi-chip module according to the 24th aspect of the invention, the degree of freedom in the arrangement of multi-chip module is raised in that the multi-chip module may be disposed in parallel or perpendicular to the target printed wiring board.

In a multi-chip module according to the 25th aspect of the invention, after mounting the bare IC chips within the dam frame and sealing the bare IC chips by filling the dam frame with resin, other bare IC chips are disposed on the dam frame and the resin. Accordingly, a larger number of bare IC chips can be disposed on the multi-chip module, which enables free and more complicated arrangement of a circuit.

In a multi-chip module according to the 26th or 27th aspect of the invention, the bare IC chips are disposed in holes or concavities of the target printed wiring board and connected to the board by means of wire bonding, or the multi-chip module is inserted in a hole of the target printed wiring board. Therefore, the total thickness is kept thin.

In a multi-chip module according to the 30th aspect of the invention, the multi-chip module is disposed on a flexible wiring board, which enables the three-dimensional disposition of multi-chip modules.

In a multi-chip module according to the 31th or 32th aspect of the invention, the sealing is achieved with a metal dam frame and heat-conductive resin, and accordingly the heat radiation from the bare IC chips is ensured, resulting in a stable operation.

In a multi-chip module according to the 33th or 34th aspect of the invention. the bare IC chips or the multi-chip module are covered with a conductive cover preventing electrodes from being short-circuited, and are shielded from electromagnetic field, resulting in a stable operation.

Industrial Applicability

As described above, a multi-chip module of the invention is miniaturized, can be easily and surely mounted on a printed wiring board in an electronic machine, yields stable operation, and is accordingly vary useful for mounting on printed wiring boards in an electronic machine.

What is claimed is:

1. A multi-chip module for mounting on another printed wiring board, comprising:
    a printed wiring board;
    a plurality of bare IC chips;
    a plurality of outer electrode pads, disposed on a peripheral portion of said printed wiring board, each outer electrode pad having a through hole in a direction normal to said printed wiring board permitting soldering of said printed wiring board to said another printed wiring board, wherein:
        said printed wiring board includes a multilayer structure having inner layers including a conductive pattern and connecting portions connecting a mounting side of each bare IC chip to said inner conductor layers in said multilayer structure;
        said bare IC chips are electrically connected to one another via said connecting portions and said conductive pattern; and
        at least one of a printed resistor element and a printed dielectric for adjusting at least one of a resistance of said printed resistor element and a capacitance associated with said printed dielectric is provided outside a plurality of areas on a surface of said printed wiring board on which said plurality of bare IC chips are mounted.

2. A multi-chip module for mounting on another printed wiring board, comprising:
    a printed wiring board;
    a plurality of bare IC chips;
    a plurality of outer electrode pads, disposed on a peripheral portion of said printed wiring board, each outer electrode pad having a through hole in a direction normal to said printed wiring board permitting soldering of said printed wiring board to said another printed wiring board, wherein:
        said printed wiring board has a multilayer structure including a plurality of inner layers and at least one resistor element, both ends of which are electrically connected to at least one conductive pattern of said inner layers; and
        at least one of a printed resistor element and a printed dielectric for adjusting at least one of a resistance of said printed resistor element and a capacitance associated with said printed dielectric is provided outside a plurality of areas on a surface of said printed wiring board on which said plurality of bare IC chips are mounted.

3. A multi-chip module for mounting on another printed wiring board, comprising:
    a printed wiring board;
    a plurality of bare IC chips;
    a plurality of outer electrode pads, disposed on a peripheral portion of said printed wiring board, each outer electrode pad having a through hole in a direction normal to said printed wiring board permitting soldering of said printed wiring board to said another printed wiring board, wherein:
said printed wiring board has a multilayer structure including a plurality of inner layers and at least one dielectric layer, both sides of which are electrically connected to at least one conductive pattern of said inner layers within said multilayer structure; and
at least one of a printed resistor element of a printed dielectric for adjusting at least one of a resistance of said printed resistor element and a capacitance associated with said printed dielectric is provided outside a plurality of areas on a surface of said printed wiring board on which said plurality of bare IC chips are mounted.

4. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a through hole in a direction normal to said printed wiring board permitting soldering of said printed wiring board to said another printed wiring board, wherein:
said printed wiring board has a multilayer structure including a plurality of inner layers, at least one resistor element, both ends of which are electrically connected to at least one conductive pattern of said inner layers within said multilayer structure, and at least one dielectric layer both sides of which are electrically connected to at least one conductive pattern of said inner layers within said multilayer structure; and
at least one of a printed resistor element and a printed dielectric for adjusting at least one of a resistance of said printed resistor element and a capacitance associated with said printed dielectric is provided outside a plurality of areas on a surface of said printed wiring board on which said plurality of bare IC chips are mounted.

5. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a through hole in a direction normal to said printed wiring board permitting soldering of said printed wiring board to said another printed wiring board;
a frame provided on said printed wiring board for enclosing and sealing said plurality of bare IC chips by filling an inside of said frame with resin, wherein:
said printed wiring board includes a multilayer structure having a plurality of inner layers including a conductive pattern and connecting portions connecting a mounting side of the bare IC to said inner conductor layers in said multilayer structure; and
said bare IC chips are electrically connected to one another via said connecting portions and said conductive pattern.

6. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a through hole in a direction normal to said printed wiring board permitting soldering of said printed wiring board to said another printed wiring board;
a frame provided on said printed wiring board for enclosing and sealing said plurality of bare IC chips by filling an inside of said frame with resin, wherein:
said printed wiring board includes a multilayer structure having a plurality of inner layers and at least one resistor element, both ends of which are electrically connected to at least one conductive pattern of said inner layers.

7. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a through hole in a direction normal to said printed wiring board permitting soldering of said printed wiring board to said another printed wiring board;
a frame provided on said printed wiring board for enclosing and sealing said plurality of bare IC chips by filling an inside of said frame with resin, wherein:
said printed wiring board includes a multilayer structure having a plurality of inner layers and at least one dielectric layer, both sides of which are electrically connected to at least one conductive pattern of said inner layers within said multilayer structure.

8. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a through hole in a direction normal to said printed wiring board permitting soldering of said printed wiring board to said another printed wiring board;
a frame provided on said printed wiring board for enclosing and sealing said plurality of bare IC chips by filling an inside of said frame with resin, wherein:
said printed wiring board includes a multilayer structure having a plurality of inner layers, at least one resistor element, both ends of which are electrically connected to at least one conductive pattern of said inner layers within said multilayer structure, and at least one dielectric layer both sides of which are electrically connected to at least one conductive pattern of said inner layers within said multilayer structure.

9. The multi-chip module as defined in any of claim 5, 6, 7, or 8, wherein:
said bare IC chips are mounted on said printed wiring board by means of a flip chip bonding.

10. The multi-chip module as defined in any of claim 5, 6, 7, or 8, wherein:
said outer electrode pads are soldered to a plurality of lands of said another printed wiring board with the multi-chip module face to face with or perpendicular to said another printed wiring board.

11. The multi-chip module as defined in any of claim 5, 6, 7, or 8, wherein:
a flexible printed wiring board is used as another printed wiring board on which the multi-chip is mounted.

12. The multi-chip module of claim 8, wherein:
said printed wiring board of said multiplayer structure is formed of at least one of a ceramic material, a glass epoxy material, and a resin material.

13. The multi-chip module as defined in any of claim 5, 6, 7, or 8 wherein:
said frame is provided with a reinforcing part railing between two of said bare IC chips.

14. The multi-chip module as defined in claim 13, wherein:
a plurality of chip electrode pads are disposed on a periphery of said bare IC chips on a bare IC chip mounting side of said printed wiring board, so that a boundary between said chip electrode pads and an area surrounding said chip electrode pads serve as a reference for positioning said frame when said frame is mounted on said printed wiring board.

15. The multi-chip module as defined in claim 14, wherein said frame is filled with resin for sealing said bare IC chips so that a surface of said resin is not higher than an upper face of said frame.

16. The multi-chip module as defined in claim 13, wherein:
a plurality of chip electrode pads are disposed on a periphery of a mounting side of said bare IC chips of said printed wiring board, and a solder resist is provided adjacent to said chip electrode pads, so that a boundary between said chip electrode pads and said solder resist serve as a reference for positioning said frame when said frame is mounted.

17. The multi-chip module as defined in claim 16, wherein:
said frame is filled with resin for sealing said bare IC chips so that a surface of said resin is not higher than an upper face of said frame.

18. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a through hole in a direction normal to said printed wiring board permitting soldering of said printed wiring board to said another printed wiring board, wherein:
said printed wiring board includes a multilayer structure having a plurality of inner layers including a conductive pattern and connecting portions connecting a mounting side of each bare IC chip to said inner layer, wherein:
said bare IC chips are electrically connected to one another via said connecting portions and said conductive pattern;
said printed wiring board is provided with a plurality of holes or concavities in which said bare IC chips are disposed; and
said bare IC chips are disposed in said holes or concavities and connected to said printed wiring board by means of wire bonding.

19. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a through hole in a direction normal to said printed wiring board permitting soldering of said printed wiring board to said another printed wiring board, wherein:
said printed wiring board includes a multilayer structure having a plurality of inner layers, at least one resistor element, both ends of which are electrically connected to at least one conductive pattern of said inner layers, and a plurality of holes or concavities in which said bare IC chips connected to said printed wiring board through a wire bonding means are disposed.

20. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a through hole in a direction normal to said printed wiring board permitting soldering of said printed wiring board to said another printed wiring board, wherein:
said printed wiring board includes a multilayer structure having a plurality of inner layers, at least one dielectric layer, both sides of which are electrically connected to at least one conductive pattern of said inner layers within said multilayer structure and a plurality of holes or concavities in which said bare IC chips connected to said printed wiring board through a wire bonding are disposed.

21. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a through hole in a direction normal to said printed wiring board permitting soldering of said printed wiring board to said another printed wiring board, wherein:
said printed wiring board includes a multilayer structure having a plurality of inner layers, at least one resistor element, both ends of which are electrically connected to at least one conductive pattern of said inner layers within said multilayer structure, at least one dielectric layer, both sides of which are electrically connected to at least one conductive pattern of said inner layers within said multilayer structure, and a plurality of holes or concavities in which said bare IC chips connected to said printed wiring board by means of wire bonding are disposed.

22. A multi-chip module for mounting on another printed wiring board, comprising:
a printed wiring board;
a plurality of bare IC chips;
a plurality of outer electrode pads, disposed on a peripheral portion of said printed wiring board, each outer electrode pad having a though hole in a direction normal to said printed wiring board permitting soldering of said printed wiring board to said another printed wiring board, wherein:
said printed wiring board includes a multilayer structure having inner layers including a conductive pattern and connecting portions connecting a mounting side of each bare IC chip to said inner layers in said multilayer structure;

said bare IC chips are electrically connected to one another via said connecting portions and said conductive pattern;

said another printed wiring board includes a hole so that the multi-chip module is inserted in said hole; and said outer electrode pads of the multi-chip module are soldered to a plurality of lands of said another printed wiring board.

23. A multi-chip module for mounting on another printed wiring board, comprising:

a printed wiring board;

a plurality of bare IC chips;

a plurality of outer electrode pads, disposed on a peripheral portion of said printed wiring board, each outer electrode pad having a through hole in a direction normal to said printed wiring board permitting soldering of said printed wiring board to said another printed wiring board, wherein:

said printed wiring board includes a multilayer structure having a plurality of inner layers and at least one resistor element, both ends of which are electrically connected to at least one conductive pattern of said inner layers;

said another printed wiring board includes a hole so that the multi-chip module is inserted in said hole; and said outer electrode pads of the multi-chip module are soldered to a plurality of lands of said another printed wiring board.

24. A multi-chip module for mounting on another printed wiring board, comprising:

a printed wiring board;

a plurality of bare IC chips;

a plurality of outer electrode pads disposed on a peripheral portion of said printed wiring board, each outer electrode pad having a through hole in a direction normal to said printed wiring board permitting soldering of said printed wiring board to said another printed wiring board, wherein:

said printed wiring board includes a multilayer structure having a plurality of inner layers and at least one dielectric layer, both sides of which are electrically connected to at least one conductive pattern of said inner layers within said multilayer structure;

said another printed wiring board is provided with a hole so that the multi-chip module is inserted in said hole; and said outer electrode pads of the multi-chip module are soldered to a plurality of lands of said another printed wiring board.

25. A multi-chip module for mounting on another printed wiring board, comprising:

a printed wiring board;

a plurality of bare IC chips;

a plurality of outer electrode pads disposed on a peripheral portion of said printed wiring board, each pad having a through hole in a direction normal to said printed wiring board permitting soldering of said printed wiring board to said another printed wiring board, wherein:

said printed wiring board includes a multilayer structure having a plurality of inner layers, at least one resistor element, both ends of which are electrically connected to at least one conductive pattern of said inner layers within said multilayer structure, and at least one dielectric layer, both sides of which are electrically connected to at least one conductive pattern of said inner layers within said multilayer structure;

said another printed wiring board is provided with a hole so that the multi-chip module is inserted in said hole; and said outer electrode pads of the multi-chip module are soldered to a plurality of lands of said another printed wiring board.

26. A multi-chip module for mounting on another printed wiring board, comprising:

a printed wiring board;

a plurality of bare IC chips;

a plurality of outer electrode pads, disposed on a peripheral portion of said printed wiring board, each outer electrode pad having a through hole in a direction normal to said printed wiring board permitting soldering of said printed wiring board to said another printed wiring board, wherein:

said printed wiring board having a multilayer structure comprising a plurality of inner layers, each inner layer including a conductive pattern and connecting portions connecting a mounting side of each bare IC chip to said inner conductor layers in said multilayer structure;

said bare IC chips are electrically connected to one another via said connecting portions and said conductive pattern; and said bare IC chips are directly connected to said outer electrode pads by means of wire bonding.

27. A multi-chip module for mounting on another printed wiring board, comprising:

a printed wiring board;

a plurality of bare IC chips;

a plurality of outer electrode pads, disposed on a peripheral portion of said printed wiring board, each outer electrode pad having a through hole in a direction normal to said printed wiring board permitting soldering of said printed wiring board to said another printed wiring board, wherein:

said printed wiring board having a multilayer structure including a plurality of inner layers and at least one resistor element, both ends of which are electrically connected to at least one conductive pattern of said inner layers; and said bare IC chips are directly connected to said outer electrode pads by means of wire bonding.

28. A multi-chip module for mounting on another printed wiring board, comprising:

a printed wiring board;

a plurality of bare IC chips;

a plurality of outer electrode pads, disposed on a peripheral portion of said printed wiring board, each outer electrode pad having a through hole in a direction normal to said printed wiring board permitting soldering of said printed wiring board to said another printed wiring board, wherein:

said printed wiring board comprises a multilayer structure including a plurality of inner layers and at least one dielectric layer, both sides of which are electrically connected to at least one conductive pattern of said inner layers within said multilayer structure; and said bare IC chips are directly connected to said outer electrode pads by means of wire bonding.

29. A multi-chip module for mounting on another printed wiring board, comprising:

a printed wiring board;

a plurality of bare IC chips;

a plurality of outer electrode pads disposed on a peripheral portion of said printed wiring board, each pad having a through hole in a direction normal to said printed wiring board permitting soldering of said printed wiring board to said another wiring board, wherein:

said printed wiring board comprises a multilayer structure including a plurality of inner layers, at least one resistor element, both ends of which are electrically connected to at least one conductive pattern of said inner layers within said multilayer structure, and at least one dielectric layer, both sides of which are electrically connected to at least one conductive pattern of said inner layers within said multilayer structure; and said bare IC chips are directly connected to said outer electrode pads by means of wire bonding.

30. A multi-chip module for mounting on another printed wiring board, comprising:

a printed wiring board;

a plurality of bare IC chips;

a plurality of outer electrode pads disposed on a peripheral portion of said printed wiring board, each outer electrode pad having a through hole in a direction normal to said printed wiring board permitting soldering of said printed wiring board to said another printed wiring board;

a conductive cover for shielding said bare IC chips disposed on said printed wiring board from an electromagnetic field, wherein:

said printed wiring board comprises a multilayer structure including a conductive pattern and connecting portions connecting a mounting side of each bare IC chip to said inner conductor layers in said multilayer structure; and said bare IC chips are electrically connected to one another via said connecting portions and said conductive pattern.

31. A multi-chip module for mounting on another printed wiring board, comprising:

a printed wiring board;

a plurality of bare IC chips;

a plurality of outer electrode pads disposed on a peripheral portion of said printed wiring board, each outer electrode pad having a through hole in a direction normal to said printed wiring board permitting soldering of said printed wiring board to said another printed wiring board;

a conductive cover for shielding said bare IC chips disposed on said printed wiring board from an electromagnetic field, wherein:

said printed wiring board comprises a multilayer structure including a plurality of inner layers and at least one resistor element, both ends of which are electrically connected to at least one conductive pattern of said inner layers.

32. A multi-chip module for mounting on another printed wiring board, comprising:

a printed wiring board;

a plurality of bare IC chips;

a plurality of outer electrode pads, disposed on a peripheral portion of said printed wiring board, each outer electrode pad having a through hole in a direction normal to said printed wiring board permitting soldering of said printed wiring board to said another printed wiring board;

a conductive cover for shielding said bare IC chips disposed on said printed wiring board from an electromagnetic field, wherein:

said printed wiring board comprises a multilayer structure including a plurality of inner layers and at least one dielectric layer, both sides of which are electrically connected to at least one conductive pattern of said inner layers within said multilayer structure.

33. A multi-chip module for mounting on another printed wiring board, comprising:

a printed wiring board;

a plurality of bare IC chips;

a plurality of outer electrode pads, disposed on a peripheral portion of said printed wiring board, each outer electrode pad having a through hole in a direction normal to said printed wiring board permitting soldering of said printed wiring board to said another printed wiring board;

a conductive cover for shielding said bare IC chips disposed on said printed wiring board from an electromagnetic field, wherein:

said printed wiring board comprises a multilayer structure including a plurality of inner layers, at least one resistor element, both ends of which are electrically connected to at least one conductive pattern of said inner layers within said multilayer structure, and at least one dielectric layer, both sides of which are electrically connected to at least one conductive pattern of said inner layers within said multilayer structure.

34. A multi-chip module for mounting on another printed wiring board, comprising:

a printed wiring board;

a plurality of bare IC chips;

a plurality of outer electrode pads, disposed on a peripheral portion of said printed wiring board, each outer electrode pad having a through hole in a direction normal to said printed wiring board permitting soldering of said printed wiring board to said another printed wiring board;

a conductive cover for shielding the multi-chip module disposed on said another printed wiring board from an electromagnetic field, wherein:

said printed wiring board comprises a multilayer structure having a plurality of inner layers including a conductive pattern and connecting portions connecting a mounting side of each bare IC chip to said inner conductor layers in said multilayer structure; and said bare IC chips are electrically connected to one another via said connecting portions and said conductive pattern.

35. A multi-chip module for mounting on another printed wiring board a printed wiring board, comprising:

a printed wiring board;

a plurality of bare IC chips;

a plurality of outer electrode pads disposed on the peripheral portion of said printed wiring board, each outer electrode pad having a through hole in a direction normal to said printed wiring board permitting soldering of said printed wiring board to said another printed wiring board;

a conductive cover for shielding the multi-chip module disposed on said another printed wiring board from an electromagnetic field, wherein:

said printed wiring board has a multilayer structure including a plurality of inner layers and at least one resistor element, both ends of which are electrically connected to at least one conductive pattern of said inner layers.

36. A multi-chip module for mounting on another printed wiring board, comprising:

a printed wiring board;

a plurality of bare IC chips;

a plurality of outer electrode pads, disposed on the peripheral portion of said printed wiring board, each outer electrode pad having a through hole in a direction normal to said printed wiring board permitting soldering of said printed wiring board to said another printed wiring board;

a conductive cover for shielding the multi-chip module disposed on said another printed wiring board from an electromagnetic field, wherein:

said printed wiring board has a multilayer structure including a plurality of inner layers and at least one dielectric layer, both sides of which are electrically connected to at least one conductive pattern of said inner layers within said multilayer structure.

37. A multi-chip module for mounting on another printed wiring board, comprising:

a printed wiring board;

a plurality of bare IC chips;

a plurality of outer electrode pads, disposed on a peripheral portion of said printed wiring board, each outer electrode pad having a through hole in a direction normal to said printed wiring board permitting soldering of said printed wiring board to said another printed wiring board;

a conductive cover for shielding the multi-chip module disposed on said another printed wiring board from an electromagnetic field, wherein:

said printed wiring board comprises a multilayer structure including a plurality of inner layers, at least one resistor element, both ends of which are electrically connected to at least one conductive pattern of said inner layers within said multilayer structure, and at least one dielectric layer, both sides of which are electrically connected to at least one conductive pattern of said inner layers within said multilayer structure.

\* \* \* \* \*